United States Patent
Eldridge et al.

(10) Patent No.: US 6,429,029 B1
(45) Date of Patent: Aug. 6, 2002

(54) CONCURRENT DESIGN AND SUBSEQUENT PARTITIONING OF PRODUCT AND TEST DIE

(75) Inventors: Benjamin N. Eldridge, Danville; Igor Y. Khandros, Orinda; David V. Pedersen, Scotts Valley; Ralph G. Whitten, San Jose, all of CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/224,166

(22) Filed: Dec. 31, 1998

Related U.S. Application Data

(63) Continuation-in-part of application No. 08/784,862, filed on Jan. 15, 1997, now Pat. No. 6,064,213.

(51) Int. Cl.$^7$ .............................................. H01L 21/66
(52) U.S. Cl. ............................. 438/14; 438/10; 438/17
(58) Field of Search ............................... 438/10, 11, 14, 438/15, 16, 17, 18

(56) References Cited

U.S. PATENT DOCUMENTS

| | | | |
|---|---|---|---|
| 5,389,556 A | * 2/1995 | Rostoker et al. | ............... 438/17 |
| 5,399,505 A | * 3/1995 | Dasse et al. | ................... 438/17 |
| 5,422,574 A | 6/1995 | Kister | ......................... 324/754 |
| 5,442,282 A | 8/1995 | Rostoker et al. | ......... 324/158.1 |
| 5,497,079 A | 3/1996 | Yamada et al. | ........... 324/158.1 |
| 5,576,554 A | 11/1996 | Hsu | |
| 5,665,989 A | * 9/1997 | Dangelo | ..................... 438/106 |
| 5,719,449 A | 2/1998 | Strauss | |

FOREIGN PATENT DOCUMENTS

| | | |
|---|---|---|
| EP | 028091 A1 | 5/1981 |
| EP | 670552 A1 | 9/1995 |
| EP | 845680 A1 | 6/1998 |
| EP | 855651 A2 | 7/1998 |
| TW | 86101160 | 6/1998 |
| WO | WO 9743656 A2 | 11/1997 |

OTHER PUBLICATIONS

Gadi Singer, "VTS 97 Keynote: The Future of Test and DFT", Jul.–Sep. 1997, pp. 11–14.
Mitch Aigner, "Embedded At–Speed Test Probe", Jul. 1997, International Test Conference, Paper 37.1, pp. 932–937.
Mentor Graphics, "Design–For–Test Data Sheet Catalog", 1997, pp. 21 pages total.
Mentor Graphics, "Improve Design Quality Through Real Test Solutions", 1998, pp. 31 pages total.
UPSYS Reseau Eurisys, "Cobra Probe Advanced Test Probe Technology–Innovative qualities devoted to the semiconductor industry", 1996, 4 pages total.
William R. Mann, General Chair, "Southwest Test Workshop", Jun. 9–12, 1996, pp. 10 pages total.

* cited by examiner

Primary Examiner—Kevin M. Picardat
(74) Attorney, Agent, or Firm—Stuart Merkadeau; N. Kenneth Burraston

(57) ABSTRACT

One embodiment of the present invention concerns a design methodology for generating a test die for a product die including the step of concurrently designing test circuitry and a product circuitry in a unified design. The test circuitry can be designed to provide a high degree of fault coverage for the corresponding product circuitry generally without regard to the amount of silicon area that will be required by the test circuitry. The design methodology then partitions the unified design into the test die and the product die. The test die includes the test circuitry and the product die includes the product circuitry. The product and test die may then be fabricated on separate semiconductor wafers. By partitioning the product circuitry and test circuitry into separate die, embedded test circuitry can be either eliminated or minimized on the product die. This will tend to decrease the size of the product die and decrease the cost of manufacturing the product die while maintaining a high degree of test coverage of the product circuits within the product die.

49 Claims, 28 Drawing Sheets

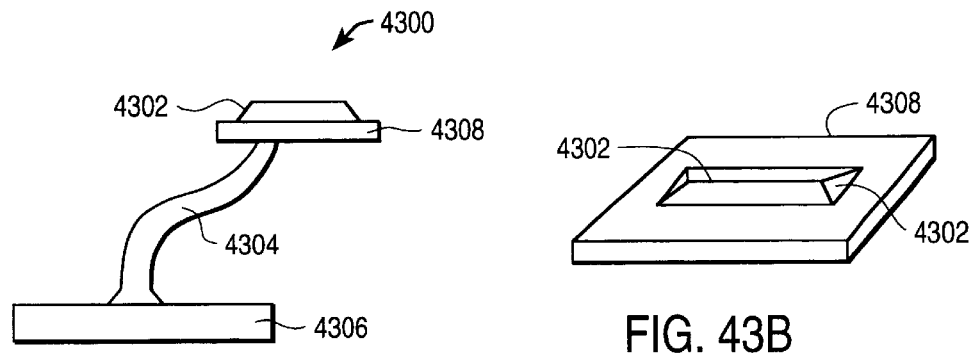
FIG. 43A
FIG. 43B
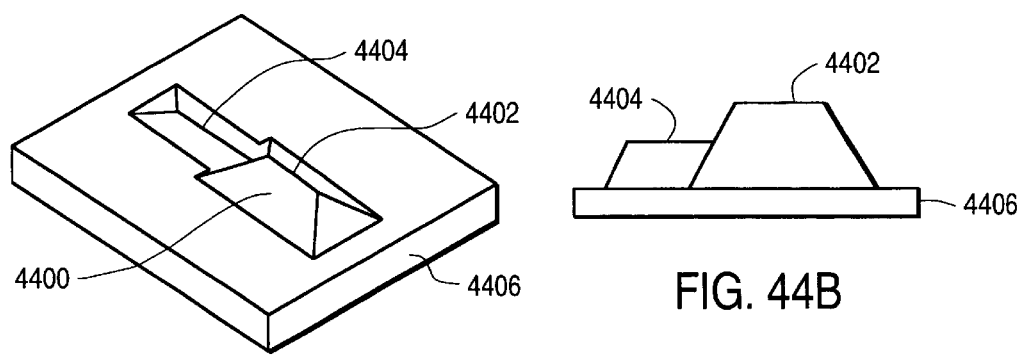
FIG. 44A
FIG. 44B
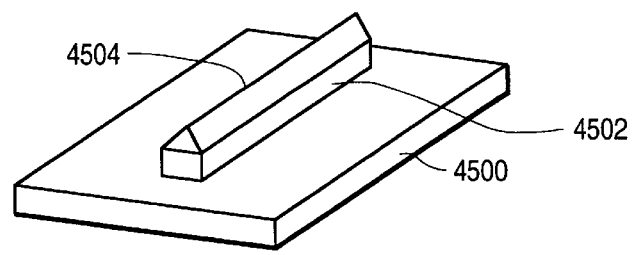
FIG. 45

CONCURRENT DESIGN AND SUBSEQUENT PARTITIONING OF PRODUCT AND TEST DIE

CROSS-REFERENCE TO RELATED APPLICATIONS

This patent application is a continuation-in-part application of commonly-owned, co-pending U.S. patent application No. 08/784,862 filed Jan. 15, 1997, now U.S. Pat. No. 6,064,213 which is incorporated by reference herein, and from which priority is claimed.

FIELD OF THE INVENTION

The present invention relates to integrated circuit (IC) semiconductor devices and, more particularly, to testing the devices.

BACKGROUND

As integrated circuit designs continue to increase in both complexity and density, design methodologies are challenged to create circuits that use Design-For-Test (DFT) techniques to improve the testability and the quality of the final product. Test methodologies are also challenged to create high-quality, low cost test solutions.

One conventional design methodology includes the process of initially designing an integrated circuit using a software design tool, simulating the overall functionality of the design or individual circuits within the design, and then generating test vectors for testing the overall function of the design. The test vectors are typically generated by an automated software tool (e.g., an Automatic Test Pattern Generator or "ATPG") that provides a particular degree of fault coverage or fault simulation for the circuitry in the product. These test vectors are then typically provided in a computer readable file to Automatic Testing Equipment (ATE) or testers. The ATE is used in a manufacturing environment to test the die at wafer sort and in packaged tests. As integrated circuit designs become more complex and operate at higher speeds, they place more demands on the testing equipment. This tends to increase the cost of ATEs and, thus, tends to increase manufacturing costs. Additionally, as integrated circuit designs become more complex, the time required to test the circuits increases. This also tends to increase manufacturing costs.

During wafer-level testing of a die, test signals are provided through input or input/output (I/O) bond pads on the die, and the test results are monitored on output or I/O bond pads. The good die that pass the wafer-level test are singulated and typically packaged by electrically connecting the bond pads to the package by means of bond wires, solder balls, or other contact structures. To accommodate the bonding wires or solder balls, the bond pads are generally very large relative to the circuit elements of the integrated circuit. Typical bond pad sizes are on the order of 100 $\mu$m (microns)×100 $\mu$m (4 mils×4 mils). The bond pads are also typically aligned in regular patterns such as peripherally along the outside perimeter of the die, in a grid pattern, or in a column or row generally through the center of the die (lead-on-center).

To improve test coverage of individual circuits, DFT tools have been developed to embed test circuitry into the design itself. For example, Built-In Self-Test (BIST) circuitry can be inserted into the design to test individual circuit blocks. BIST is particularly useful for testing circuit blocks that are not readily accessible by bond pads of the device under test (DUT). Automated DFT tools (such as those provided by Mentor Graphics of Wilsonville, Oregon) for generating BIST circuitry, such as memory BIST for testing memory blocks and logic BIST for testing logic blocks, are well known. The results of tests conducted by BIST circuitry are provided directly to external I/Os, or are indirectly provided to the external I/Os through boundary scan circuitry that may be included in the design. Additional internal embedded test circuitry such as SCAN chain circuitry may also be added to the design to increase the internal testability of internal sequential designs.

If a die already has all of its peripheral, grid, or lead-on-center bond pad locations dedicated to a device function, then adding additional bond pads in the predetermined bond pad alignment to support the on-chip testing circuitry can result in a substantial increase in the size of the die. This tends to have a corresponding increase in the cost of the die. Generally, larger die are more prone to defects and consequently more expensive to manufacture. Additionally, on-chip testing circuitry can result in a significant increase in test time as many clock cycles may be required to load test input data and subsequently output test results from a few available bond pads. On-chip testing circuitry also does not allow for direct external access to internal circuit nodes. Test input data and test results must pass through the SCAN circuitry or BIST circuitry before it can be monitored. This introduces additional circuits that can mask failures in the circuit intended to be tested, or can introduce new failures caused by SCAN or BIST circuitry.

Additionally, many designs are I/O limited since only a limited number of leads (e.g., bond wires) may be accommodated in a given packaging scheme. Moreover, to test I/O functionality of a die, these same lead locations must be used. It would be advantageous to access more points in a circuit, especially for testing. It would also be advantageous if the access points could be located with a high degree of positional freedom. Small size, large number, and arbitrary or selective positioning of the access points would also be advantageous.

With embedded test circuitry, the design methodology of an integrated circuit includes the process of: initially designing the integrated circuit using a software design tool; simulating the overall functionality of the integrated circuit or individual circuits within the design; generating embedded test circuitry to test individual circuits or circuit blocks in the design; and generating test vectors for functionally testing the device by an ATE.

The amount of embedded test circuitry to add to a particular design typically requires balancing the benefits of increased fault coverage and potentially decreased test time (e.g., as compared with an ATE) with the disadvantages of increasing both the die size and probability of fabrication defects which each result in increased manufacturing cost of the end product. At one extreme, designs could include elaborate embedded test circuits that test every circuit node of all internal circuits, however, these designs would be prohibitively expensive as the die size would primarily be a function of the size of the test circuitry. At another extreme, designs could include no embedded test circuitry and rely solely on test vectors supplied by an ATE to test the functionality of the design at the wafer level or in packaged form. This latter approach, however, tends to provide reduced fault coverage, a lower product quality, and increase manufacturing costs by using expensive ATEs and by increasing test times. One approach to minimize the cost of using expensive ATEs is disclosed in U.S. Pat. No. 5,497,079 (the '079 patent). The '079 patent condenses the general functions of the ATE into a general function test chip that, under the control of a host computer can test another semiconductor chip. The test chip can be disposed on a probe card or brought into electrical contact with the chip to be tested through a motherboard. Another approach is disclosed in U.S. application Ser. No. 08/784,862, filed Jan. 15, 1997, in which wafer level test of semiconductor chips is performed by test chips that have general purpose test circuitry.

In between the two extremes, typical integrated circuit designs strike a balance between the amount of embedded circuitry and tests that will be performed by an ATE. Typically, embedded circuitry is limited to approximately 5–15% of the total die area of the design, and test vectors are generated for an ATE to test the overall function of the design. This balance, however, results in less than optimal fault coverage while still requiring the use of expensive ATEs.

It is desirable to have design and test methodologies that break the direct correlation between fault coverage or testability and the cost of testing or manufacturing a design.

SUMMARY OF THE INVENTION

One embodiment of the present invention concerns a design methodology for generating a test die for a product die including the step of concurrently designing test circuitry and a product circuitry in a unified design. The test circuitry can be designed to provide a high degree of fault coverage for the corresponding product circuitry generally without regard to the amount of silicon area that will be required by the test circuitry. The design methodology then partitions the unified design into the test die and the product die. The test die includes the test circuitry and the product die includes the product circuitry. The product and test die may then be fabricated on separate semiconductor wafers. By partitioning the product circuitry and test circuitry into separate die, embedded test circuitry can be either eliminated or minimized on the product die. This will tend to decrease the size of the product die and decrease the cost of manufacturing the product die while maintaining a high degree of test coverage of the product circuits within the product die. The test die can be used to test multiple product die on one or more wafers.

Other objects, features, and advantages of the present invention will be apparent from the accompanying drawings and from the detailed description which follows below.

BRIEF DESCRIPTION OF THE DRAWINGS

The features and advantages of the present invention are illustrated by way of example and are by no means intended to limit the scope of the present invention to the particular embodiments shown, and in which:

FIG. 43A is a side cross-sectional view of another embodiment of a spring contact element;

FIG. 43B is a perspective view of the spring contact element of FIG. 43A;

FIG. 44A is a perspective view of another embodiment of a spring contact element;

FIG. 44B is a side cross-sectional view of the spring contact element of FIG. 44A;

FIG. 45 is a perspective view of another embodiment of a tip structure for a spring contact element;

DETAILED DESCRIPTION

In the following detailed description of the present invention numerous specific details are set forth in order to provide a thorough understanding of the present invention. However, one skilled in the art may practice the invention without these specific details. In some instances, well known methods, procedures, and components have not been described to avoid obscuring the present invention.

Figure 1:
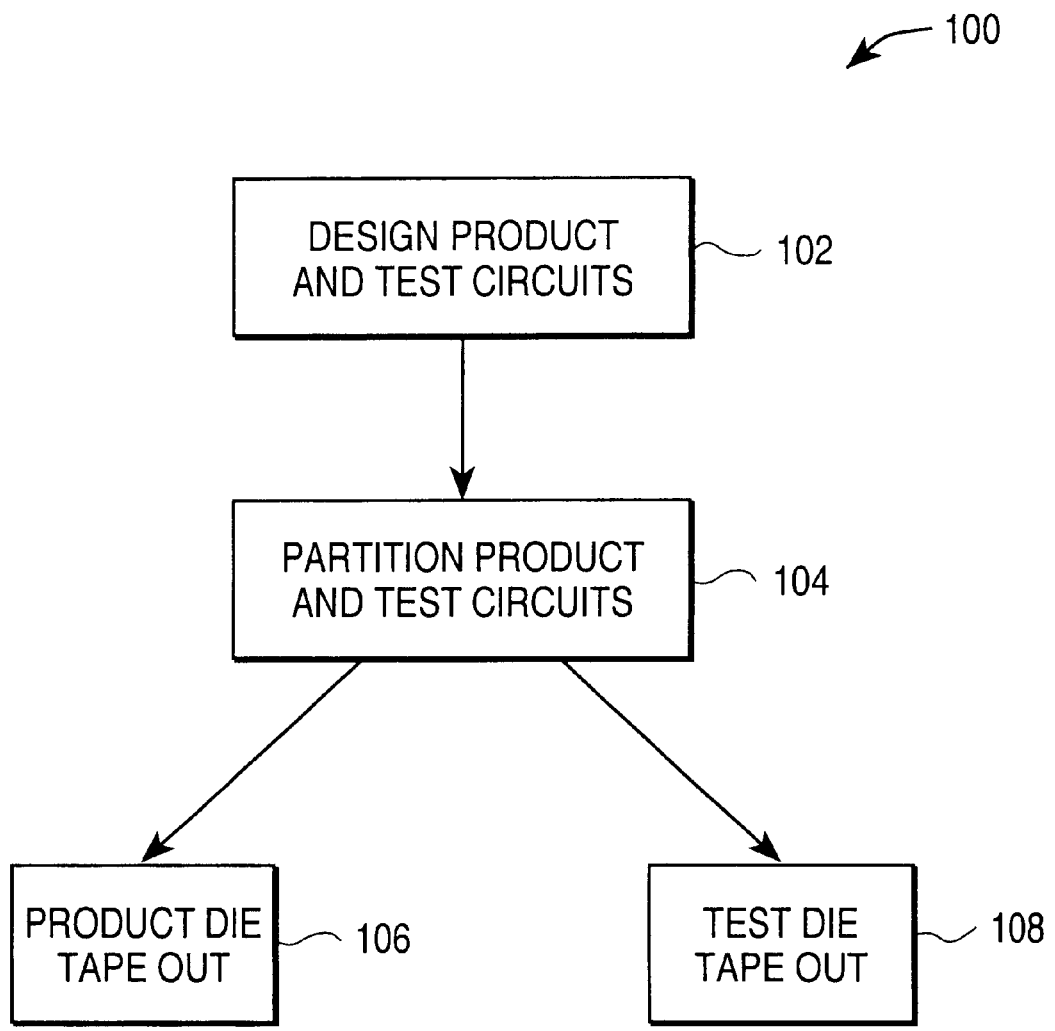
FIG. 1 is a design methodology for designing product and test die according to one embodiment of the present invention.
Figure 2:
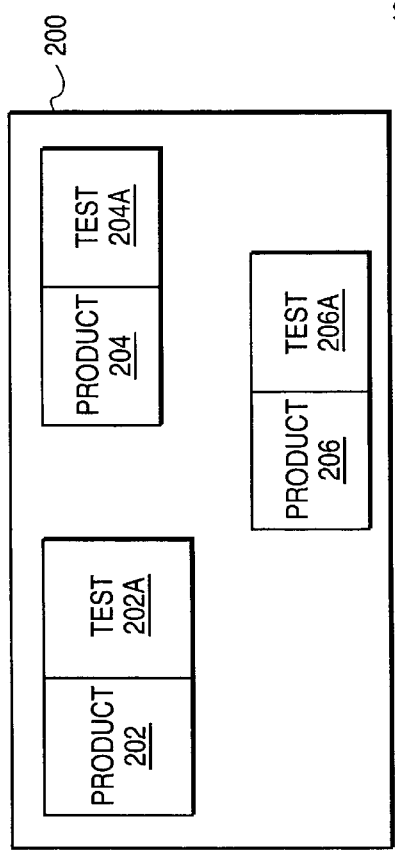
FIG. 2 is a block diagram of unified product and test circuitry design according to one embodiment of the present invention.
Figure 4:
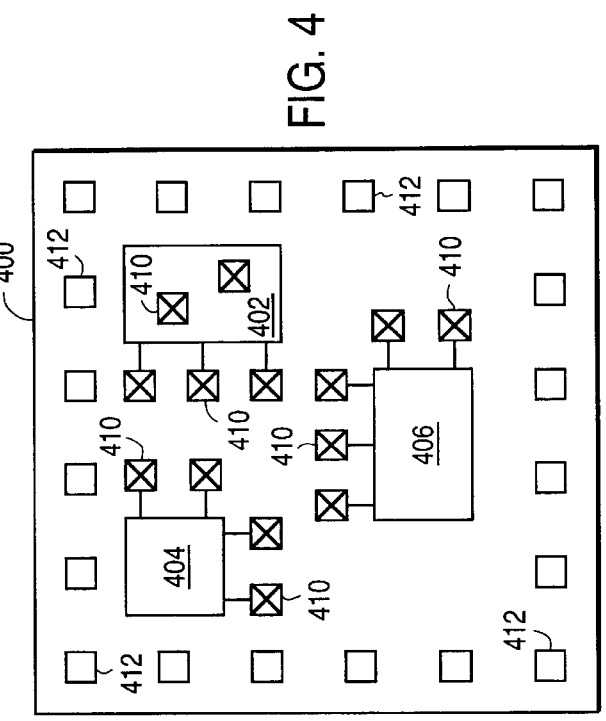
FIG. 4 is a block diagram of a test die generated after the partition of the unified design of FIG. 2.
Figure 3:
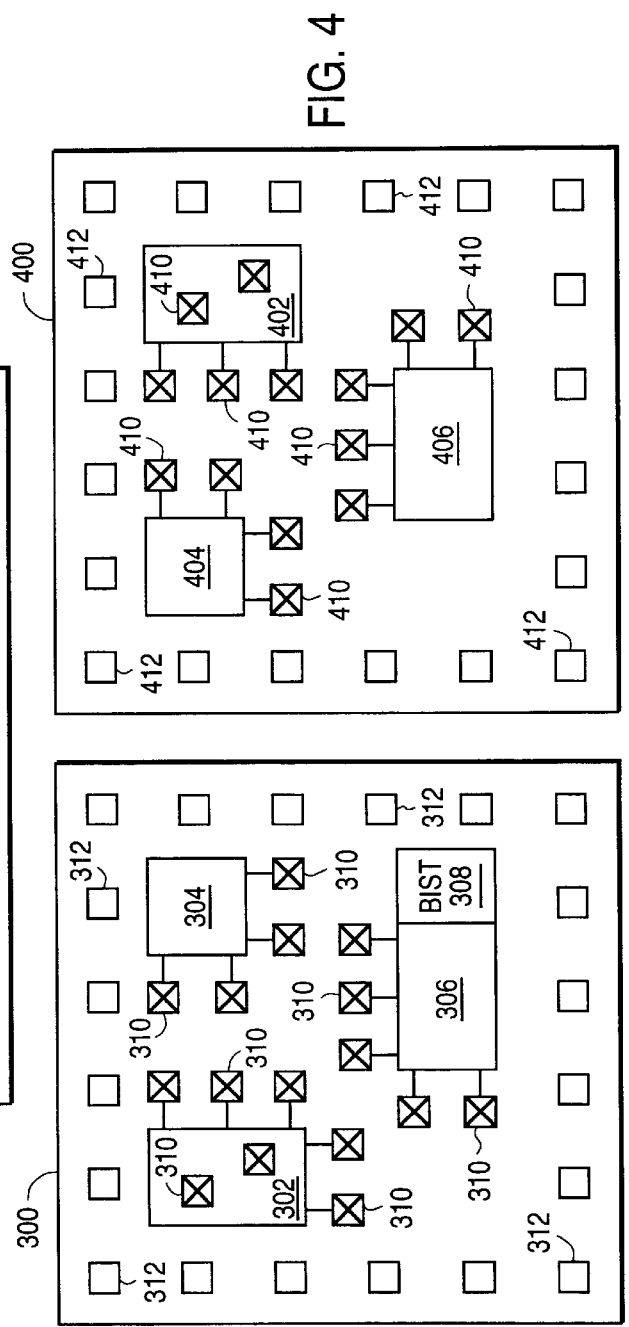
FIG. 3 is a block diagram of a product die generated after a partition of the unified design of FIG. 2.

FIG. 1 shows one embodiment of a design methodology 100 for designing a product die and a corresponding test die that includes test circuitry for providing test signals to, or monitoring signals from, one or more circuits on the product die. FIGS. 2–4 illustrate product die and test die generated by design methodology 100.

Throughout this application the terms "product die" and "product device" refer to a single instance of an integrated circuit that is formed on a semiconductor wafer or on an insulating or other appropriate substrate. These terms may also refer to a device under test (DUT). The term "product circuit" refers to a circuit of the product die which may be composed of active or passive components including integrated semiconductor circuitry, integrated microelectrical mechanical structures or systems (MEMS), or other appropriate circuit elements. Additionally, the terms "test die" and "test device" refer to an integrated circuit that is formed on a semiconductor wafer or on an insulating or other appropriate substrate. The test die includes circuitry for providing test signals to, and/or monitoring signals from, the product die. The test die may also be composed of active or passive components including integrated semiconductor circuitry, integrated MEMS, or other appropriate circuit elements to test or monitor the product die. The test die and product die may be later packaged into any commonly known package including Land Grid Array packages (e.g., a Ball Grid Array package (BGA), a Pin Grid Array (PGA) package), a control collapse chip connection (C4) package, a flip-chip package, any other surface mount package, dual inline packages (DIPs), and the like.

At step 102, circuits for the product die and test die are designed in a unified design 200. The design may be performed on conventional Computer Aided Design (CAD) systems using conventional software tools to design product circuits 202, 204, and 206 and test circuits 202A, 204A, and 206A in, for example, a VHDL or Verilog HDL format. Test circuits 202A, 204A, and 206A, sometimes collectively referred to as a "test bench," are designed to be as robust as desirable. That is, test circuits 202A, 204A, and 206A may be designed to incorporate as many test functions as is desirable to test their corresponding product circuits 202, 204, and 206, respectively. A test circuit may be designed to provide 100% fault coverage for its corresponding product circuit, or may be designed for any other desired degree of fault coverage. In contrast to previous Design-For-Test (DFT) design methodologies, test circuits 202A, 204A, and 206A may be so designed without regard to the amount of silicon die area to implement the test circuitry. For one embodiment, the test circuitry and product circuits may each be designed such that resultant product die and test die are approximately the same size. For other embodiments, the product die and test die may have different sizes.

At step 104, the product and test circuits are partitioned into separate product die and one or more test die, respectively. By partitioning the test circuitry to a separate test die, the test circuitry on the product die can be either minimized or eliminated. This may decrease the die size of the product die thus decreasing the chance of fabrication defects, and generally decreasing manufacturing costs, while increasing the testability of the product die. The external test circuitry supplying the test stimuli may provide an increased number of tests without impacting the size of product die 300. Without BIST circuitry included in a test input or output signal path, the likelihood of more accurately determining the location of a failure increases as there is no on-chip test circuitry to mask the failure or to introduce further failures. Additionally, speed parameters or the timing of signals into and out of a circuit block or a circuit node may be more accurately measured and monitored without introducing delays caused by intermediary on-chip test circuitry.

The product die design is taped out at step 106, and the test die design is separately taped out at step 108. The resultant product die 300 is then fabricated on a semiconductor wafer (not shown) with many other identical product die. Product die 300 includes product circuits 302, 304, and 306 that may be any digital, analog, or other circuitry that correspond to product circuits 202, 204, and 206, respectively.

The resultant test die 400 is fabricated including test circuits 402, 404, and 406. Test circuits 402, 404, and 406 may be any digital, analog, or other test or monitoring circuitry that correspond to test circuits 202A, 204A, and 206A, respectively, and which test or monitor signals from product circuits 302, 304, and 306, respectively. For example, each test circuit may include functional circuitry (e.g., test pattern generators, sequencers, digital signal processing devices, formatters, analog-to-digital converter, digital-to-analog converters, failure analysis circuitry, etc.) to test the logical operation of a product circuit, and circuitry to test AC parametrics (e.g., timing of internal signals, speed of a circuit, etc.) and DC parametrics (e.g., voltage and current levels, power dissipation, etc.).

Figure 5:
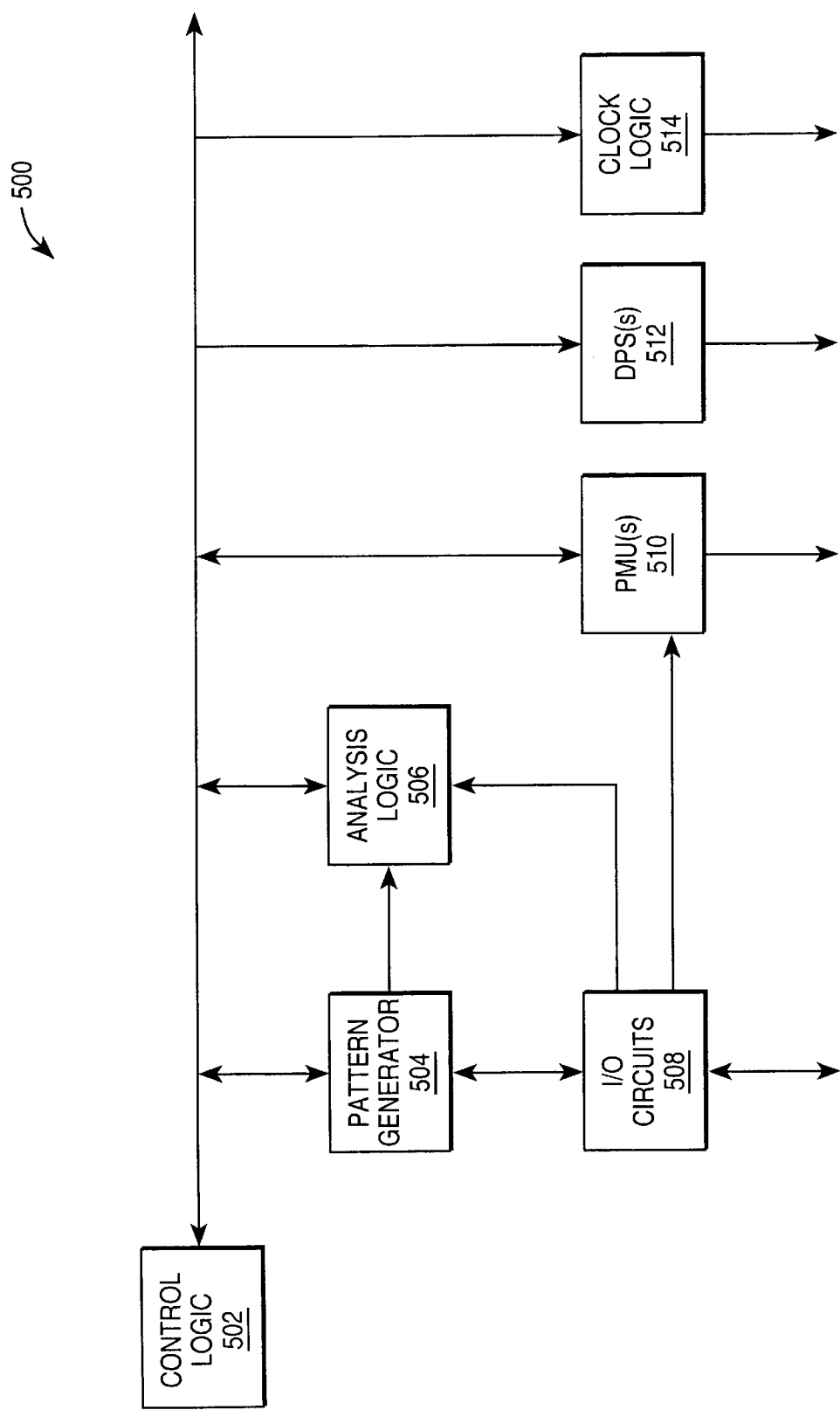
FIG. 5 is a block diagram of one embodiment of test circuitry in a test die.

While each test circuit is designed to support specific testing of its corresponding product circuit, one embodiment of an exemplary test circuit 500 is shown in FIG. 5. Test circuit 500 includes control logic 502 that controls the overall operation of test circuit 500. Control logic 502 may be, for example, a sequencer. Working in conjunction with control logic 502 are pattern generator 504, analysis logic 506, one or more parametric measuring units (PMUs) 510, one or more digital power supplies (DPSs) 512, and clock logic 514. Pattern generator 504 generates one or more test patterns that are communicated to product circuits in product die 300 through input/output (I/O) circuits 508. Pattern generator 504 may include memory for storing patterns. Analysis logic 506 analyzes the signals received from product circuits of product die 300 via I/O circuits 508. Analysis logic 506 may include compare logic to compare an expected result with that received from I/O circuits 508. PMU 510 measures the voltage and current levels of signals received by I/O circuits 508. For example, PMU 510 may measure leakage currents, source currents and voltages, sink currents and voltages, power dissipation, and the like. DPS 512 provides one or more power supply voltages to the product circuit under test. For alternative embodiments, power may be provided from a source other than the test die. Clock logic 514 may be included to provide a clock signal to the product circuit under test. For asynchronous circuits, the clock signal may not be needed. Again, test circuit 500 is an illustration of one embodiment of a test circuit such as test circuits 402, 404, and 406. Any other embodiment may be used. All of the circuit blocks shown in FIG. 5 may be included in each test circuit 402, 404, and 406, or one or more of any of the circuit blocks of FIG. 5 may be shared by multiple test circuits 402, 404, and 406.

Again with reference to FIGS. 1–4, partitioning step 104 may be implemented in a CAD DFT software tool that first determines the logical interconnection points between each product circuit and its corresponding test circuit, and then prepares logic and physical descriptions of each of the product and test die. The interconnection points result in special contact points or pads (test pads) 310 and 410. Pads 310 provide test signals to, or output signals from, product circuits 302, 304, and 306. As will be described in greater detail below, pads 310 can be brought into electrical contact with pads 410 of test die 400 by means of a contact structure (e.g., spring contact element, probe card probes, etc.) so as to communicate with test circuits 402, 404, and 406. Pads 410 may also be used to communicate with bond pads 312.

As shown in FIGS. 3 and 4, pads 310 and 410 may be physically disposed about a particular circuit under test, or they may be disposed over circuitry to provide more direct access to particular circuit nodes. In general, pads 310 and 410 may be disposed anywhere on their respective product die and test die including, as shown in FIG. 3, an area of product die 300 that is surrounded by bond pads 312. Pads 310 and 410 may also be disposed in the same predetermined alignment of the bond pads or outside of the region surrounded by the bond pads. Bond pads 312 are conventional input, output, or I/O pads that receive probe tips during wafer sort, or receive a bonding wire or solder ball. Bond pads 312 are conventionally used to operate product die 300 as a whole. Similarly, test die 400 includes bond pads 412 that may be used to test (e.g., during wafer sort) the overall functionality of test die 400, or to bond out the test die to pins of a semiconductor package.

The size of product die 300 may not increase for a given size and number of pads 310, when pads 310 are disposed within the area surrounded by bond pads 312. Additionally, by moving test circuitry to a separate test die, bond pads previously used for communicating with internal test circuitry may be omitted. This may further reduce the size of product die 300. For other embodiments, the size of product die 300 may be increased by the addition of pads 310. For one embodiment, pads 310 may be sized to be smaller than bond pads 312.

For an alternative embodiment, partitioning step 104 may determine that no additional interconnection points are required to test product die 300. For example, partitioning step 104 may determine that bond pads 312 can be used to test the overall functionality of product circuits 302, 304, and 306, and then can be reassigned (i.e., have a dual function) to be used to interface with test circuits 402, 404, and/or 406 when using test die 400. In this embodiment, the number of special contact pads may be zero, or a smaller number than that required in the previous embodiments.

After partitioning at step 104, some BIST circuitry such as BIST 308 may be retained in product die 308. For example, BIST circuitry may advantageously retained in product die 300 to test high-speed circuits that would be unduly loaded by adding a pad 310, or when there is insufficient space on product die 300 to include pads 310 to interface with test die 400.

For another embodiment, design methodology 100 may use preexisting or predetermined test circuitry to generate appropriate product circuitry. For example, at step 102, a product circuit can be designed to be tested at a desired level of fault coverage by a predetermined test circuit. Steps 104–108 would then remain the same. This embodiment may be particularly appropriate, for example, when the product circuits in the product die are predictable such as in memory circuits. The test circuitry to test these highly predictable architectures may be well-known and well-tested (i.e., those that generate march patterns, galloping row and column patterns, etc.), and may thus may be used while only having to adjust the product circuitry to accommodate the existing test circuitry. Additionally, the test circuitry may have been previously created on an existing test die, and partitioning step 104 can determine how to layout the product circuitry to maintain the predetermined test circuitry (e.g., by appropriately adjusting the product circuitry, or adding interconnection points between the test and product circuitry).

Figure 6:
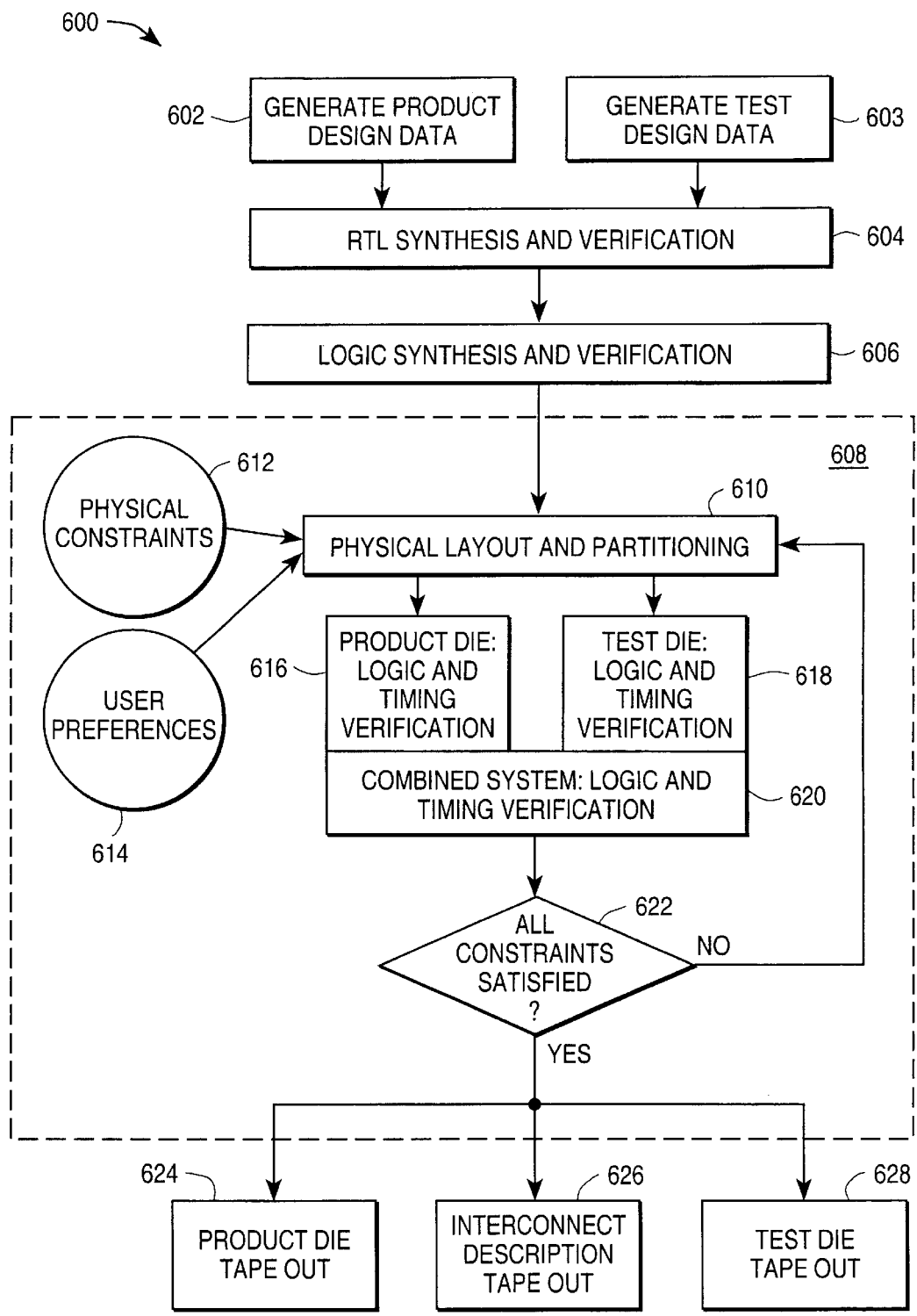
FIG. 6 is a design methodology for designing product and test circuits according to another embodiment of the present invention.

FIG. 6 shows another embodiment of a design methodology 600 for designing product die 300 of FIG. 3, and one or more of test die 400 of FIG. 4.

At step 602, product design data is generated for product circuits 202, 204, and 206, and at step 603 test design data is generated for test circuits 202A, 204A, and 206A. The design data is generated by a CAD software design tool in response to input from a circuit designer about the circuits. The design data may reside in a computer in VHDL or Verilog HDL format. The test design data may be automatically generated by CAD DFT software tools with or without input from the circuit designer. As described above with respect to design methodology 100, the test design data may be such that the test circuitry produced therefrom is as robust as is desired by the circuit designer.

At step 604, a register-transfer-level (RTL) description of a unified design including both the product and design data is generated and verified by the CAD software. At step 606, logic synthesis and verification of the unified RTL description is generated. At this point in the process, software descriptions of the unified product and test circuits is complete.

A test software tool 608 takes the unified design output from step 606 and produces data for taping out and subsequently fabricating product die 300, one or more separate test die 400, and an interconnect description. At step 610, software tool 608 partitions the unified design into separate product die and test die descriptions and generates physical layouts (e.g., in silicon). This step is performed while taking account of physical constraints 612 and user preferences 614. Constraints 612 and 614 may be input to software tool 608 prior to execution of design methodology 600, or software tool 608 may prompt a user for this input during run-time.

Physical constraints 612 include, for example, the die sizes of the resultant product die and test die, the number of bond pads or special contact pads on each die, the size of the bond pads and special contact pads on each die, process constraints, or process technologies, and the like. Physical constraints 612 may be used by software tool 608 to decide which circuitry and how much circuitry to partition between the product die and test die. For one example, a maximum die size for product die 300 may be programmed as a parameter for software tool 608 when performing step 610. If partitioning the product circuits and test circuits would yield too many special contact pads on product die 300 such that the size of the product die would exceed the maximum desired die size, software tool 608 could reconfigure the test circuitry to require fewer interconnection points to the product circuits, replace some of the test circuitry on the test die with BIST circuitry on the product die (i.e., such as BIST 308 of FIG. 3), and/or remove some of the test circuitry altogether. For another example, a design constraint may be that no special contact pads should be generated on the product die and/or the test die. Software tool 608 may partition test and product circuits appropriately such that the product die have dual-purpose bond pads; first to test the overall functionality of the product die, and second to test the individual product circuits using the test circuitry. Appropriate circuitry to enable or program this dual functionality may be included in the product die and/or test die.

For another example, software tool 608 may determine that the requisite test circuits are best implemented in different process technologies (e.g., BiCMOS v. CMOS), and thus may generate multiple test die to support the test circuitry from the different process technologies. For yet another example, software tool 608 may determine that some of the requisite test circuits are best implemented in a test die having analog circuitry, and that other requisite test circuits are best implemented in a separate test die having digital circuitry.

Another constraint that may be taken into account by software tool 608 is whether one or more of the test circuits of the test die has been predetermined. For example, as discussed above, a product circuit can be designed to be tested at a desired level of fault coverage by a predetermined test circuit. Predetermined test circuits may be particularly useful, for example, when the product circuits in the product die are predictable such as in memory circuits. In this example, software tool 608 determines how to partition the circuits to maintain the predetermined test circuitry while adjusting the product circuitry appropriately, or adding interconnection points between the test and product circuitry appropriately. Additionally, the test circuitry may have been previously created on an existing test die, and software tool 608 can determine how to layout the product circuitry to maintain the predetermined test circuitry (e.g., by appropriately adjusting the product circuitry, or adding interconnection points between the test and product circuitry).

Software tool 608 may also perform step 608 while taking account of other predetermined constraints such as user preferences 614. User or circuit designer preferences 614 include, for example, the cost of providing connections between the product and test die, the cost of the product die, the cost of the test die, timing priorities, test accuracy, fault coverage, and the cost of interconnections between the test die and an external host device that may control or communicate with the test die. The term "cost" is used here in the broadest sense and includes manufacturability, ease of use, and the like.

The cost of providing interconnections between the product and test die includes the cost associated with forming the special contact pads, of forming interconnect elements for communicating between the product and test die, and ease of performing wafer sort and further testing with a certain number of special contact pads provided on the product and test die. If the cost of providing interconnections is low, a circuit designer may indicate that software tool 608 can partition the circuits regardless of the number of interconnects required between the product and test die. However, if the cost of providing interconnections is high, the circuit designer may indicate that the software tool 608 should partition the circuits to minimize or limit the number of interconnections.

The monetary cost of the resultant product die and test die may also be used by software tool 608 to determine how to partition the product and test circuits. For example, if after partitioning, there is sufficient space on the product die to include special contact pads for testing the product circuit without increasing the product die size, then the monetary cost of the product die does not increase by adding special contact pads and including corresponding test circuit in the test die. Thus, in this example, software tool 608 could partition the product and test circuits and generate all of the required interconnection points. However, if after partitioning, there was insufficient space to add all of the initially desired special contact pads to the product die (or test die) without increasing the die size and thus the monetary cost of the product die (or test die), then software tool 608 could reduce the number of interconnections and pads to maintain the monetary cost of either the product die and test die below a predetermined user preference.

Timing priorities and test accuracy may also be used by software tool 608 to determine how to partition the product and test die. For example, high-speed product circuits may be unnecessarily loaded and delayed by adding special contact pads. Thus, software tool 608 may thus embed some of the test circuitry as BIST circuitry into the product die to test these circuits to avoid timing and test accuracy delays.

Fault coverage of testing the product circuits may also be used by software tool 608 to determine how to partition the product and test die. For example, if 100% or an otherwise high degree of fault coverage is desired by the circuit designer, then the test circuits generated in steps 602–606 may be separated into the test die and the requisite number of the interconnection points or special contact pads generated on both the product die and test die. However, if a lower degree of fault coverage is desired by the circuit designer, then some of the test circuits generated by steps 602–606 may not be partitioned out into the test die. The circuit designer may input which product circuitry is considered more important to test than others, or the desired level of test coverage desired on a product circuit-by-circuit basis. Software tool 608 may use this input to decide which test circuits to keep and which to discard in the final test die.

The cost of interconnections of nets between the test die and an external device may also be used by software tool 608 to determine how to partition the product and test die. The external device may be, for example, a host controller or another test die. The test die may need to communicate with a host controller or other device to report the results of testing the product die. For other embodiments, software tool 608 may generate multiple test die each having particular test circuits for one or more product die. The number of interconnection points, such as bond pads 410 of FIG. 4 or special contact pads 412, required to support the communication between these devices may impact the size of the test die and thus may be limited (or not) by user input.

After the partitioning of the product and test circuits into product die and test die descriptions, logic and timing verification of the product die is performed at step 616, and logic and timing verification of the test die is performed at step 618. Logic and timing verification of the combined system of the product die and test die working together may be performed at step 620. In response to steps 616–620, software tool 608 determines if the all of the physical constraints 612 and user preferences 614 have been satisfied at step 622. If the constraints 612 and 614 have been satisfied, then the product die is taped out at step 624, the test die is taped out at step 628, and a description of the interconnect points between the die may be generated. If the constraints 612 and 614 have not been satisfied, then software tool 608 iterates the process. That is, software tool 608 returns to step 610 and repartitions the product circuits and test circuits in a second attempt to satisfy constraints 612 and 614. This process may continue until all the constraints are satisfied. If software tool 608 determines that it cannot satisfy all of the constraints, then it may stop and inform the designer. The designer may then change the design, or change the constraints.

Figure 7:
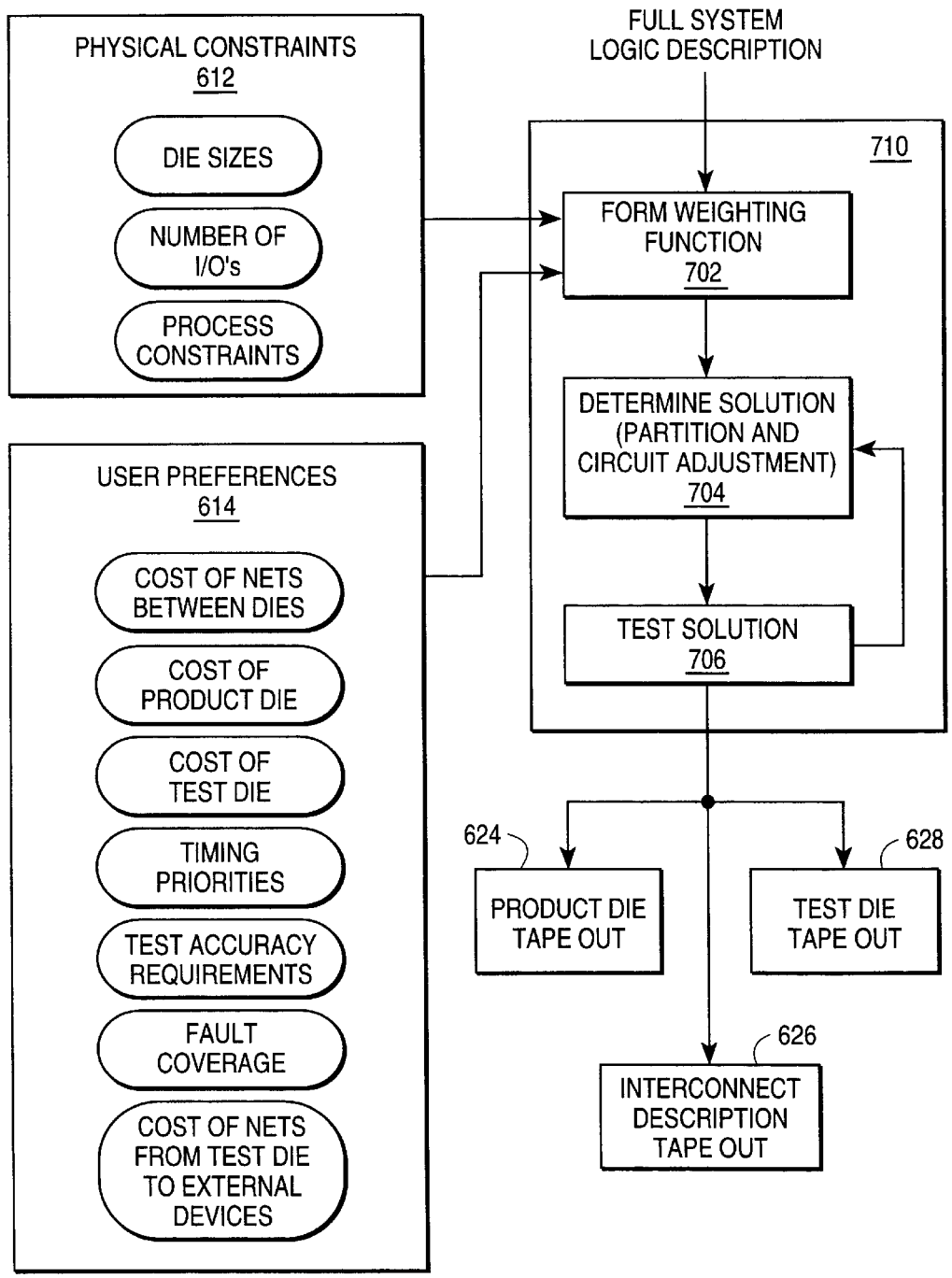
FIG. 7 is one embodiment of the process of determining the partitioning of the product and test circuits.

One embodiment of partitioning step 610 is shown as step 710 in FIG. 7. Partitioning step 710 uses conventional weighting techniques to determine product die and test die layouts. For example, a weighting function is formed at step 702 in response to the full system logic description from step 606, physical constraints 612, and user preferences 614. The weighting function describes the relative trade-offs and constraints for a given partition. Many different numerical analysis techniques may be used to find the optimum solution of the partitioning problem described by the weighting function. One such technique is "simulated annealing" wherein the design tool simulates the physical process of annealing by mathematically raising a system to a high temperature. This allows the system to rapidly find solutions of minimum energy or minimum cost. As applied to step 704, simulated annealing may be used to find an optimum solution by varying the number of special contact pads, amount of test circuitry or any physical constraint or user preference to determine the best partitioning of the product and test circuits between the product die and test die The partitioning of the design at step 704 may cause circuit adjustments in the test circuitry, the product circuitry, and/or BIST circuitry on the product die. The adjustments may include adding, removing, or altering test circuitry and/or BIST circuitry to optimally test the product circuits. The adjustments may also include adding additional test circuitry to the test nodes that have been introduced by the partitioning itself. This step may be completed automatically or interactively with the circuit designer.

When a partition is generated at step 704, the solution is tested, evaluated, and/or simulated at step 706 to determine if an optimum solution has been generated and all of constraints 612 and 614 have been satisfied. If the weighting function is defined correctly, then the tested solution would satisfy all of the constraints 612 and 614 and would generate product die with or without BIST circuitry, a test die, and an interconnect description. If the user is not satisfied with the solution, the constraints may be adjusted to form a new weighting function and generate a new partition of circuitry, special contact pads, die size, etc. between the product die and test die.

Figure 8:
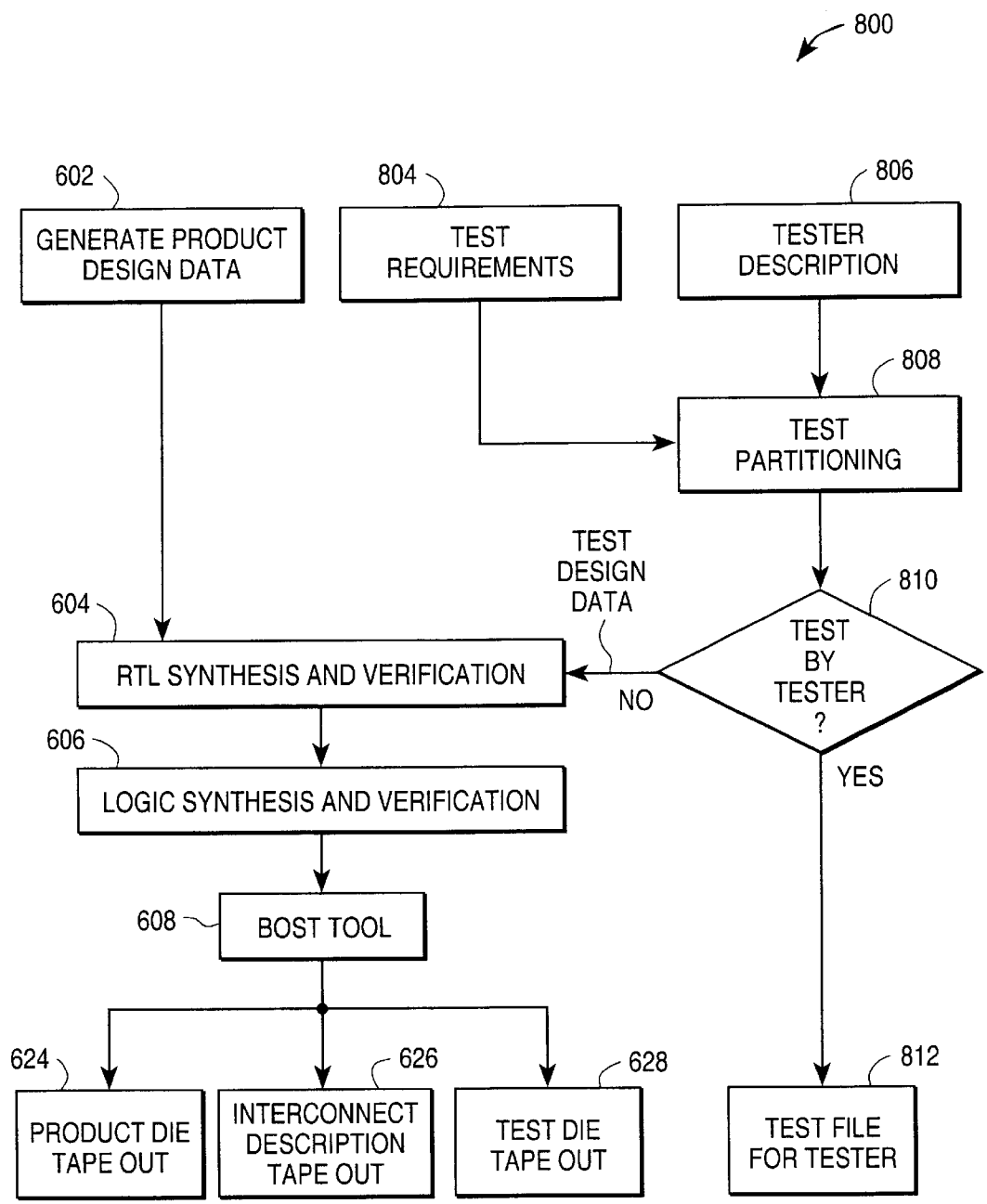
FIG. 8 is a design methodology for designing product and test circuits according to yet another embodiment of the present invention.

FIG. 8 shows design methodology 800 that is a variation of design methodology 600 of FIG. 6 (or design methodology 100 of FIG. 1). In some applications, the resultant test die generated by design methodology 600 (or 100) may communicate with a tester or host controller such as an ATE, general purpose computer, or other control logic or system. The tester may, for example, start and stop the tests performed by the test die, provide power to the test die, indicate a test sequence to the test circuits of a test die, indicate test sequences between multiple test die, catalog and report on the test results received from the test die, and the like. The tester may also be used to test the product die as a whole, for example, during wafer sort where the test die is used to test individual product circuits or nodes, and a separate probe card controlled by the tester is used to test the product die as a whole. Tests can thus be selected to be distributed between the tester and the test die.

In design methodology 800, the test design data supplied to RTL synthesis and verification step 604 is determined by steps 804–810. At step 808, tests are partitioned between the tester and the test die in response to test requirements 804 for testing the product circuits, and a description of the tester's capabilities 806. If a test is to be performed by a test die (as determined at step 810), then the test it is provided as part of the test design data to step 604 together with the product circuits design data. If, however, the test is to be performed by the tester, the test is stored in a test file 812 for the tester.

Figure 9:
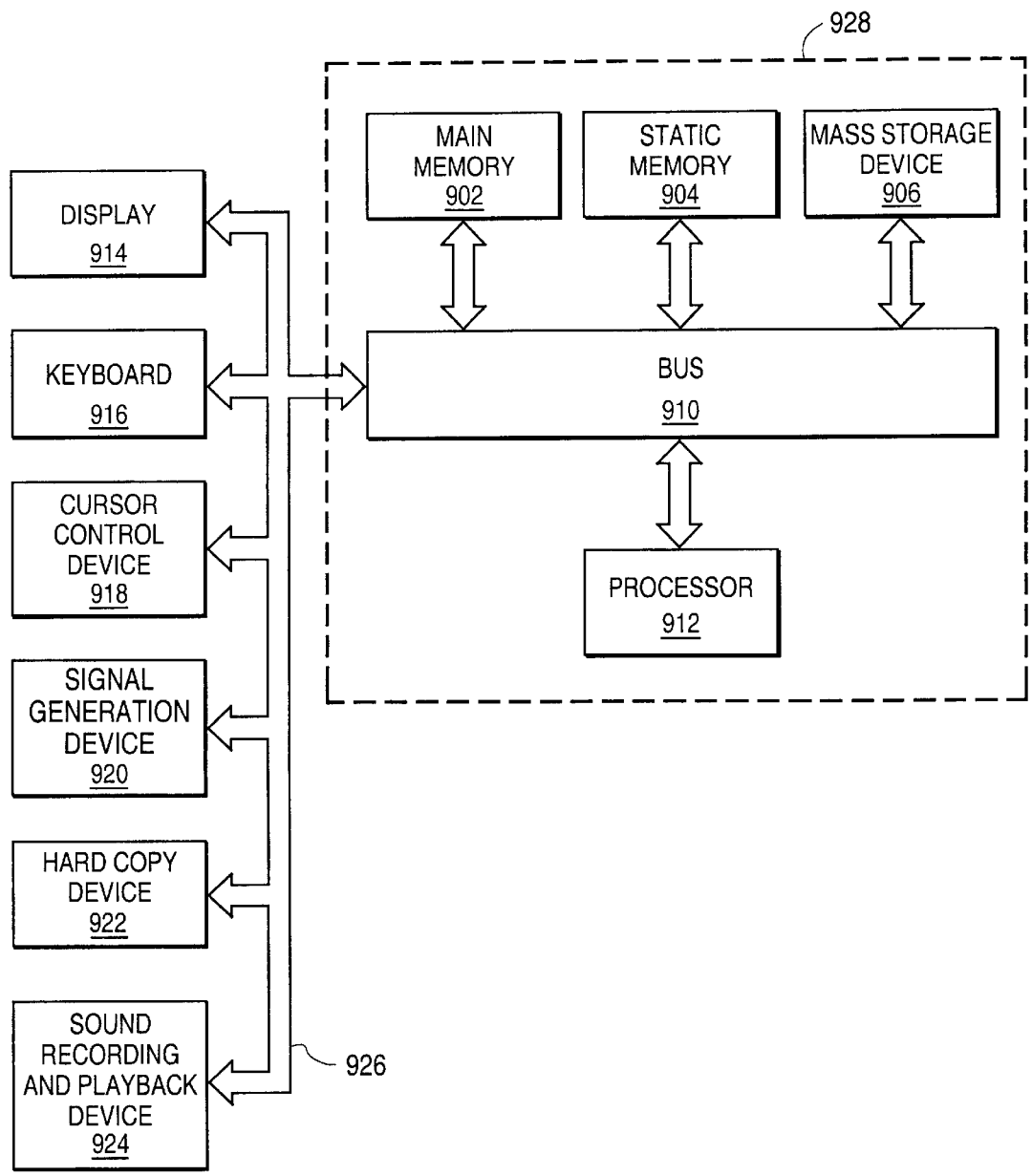
FIG. 9 is a block diagram of one embodiment of a computer system on which the processes of FIGS. 1 and 6–8 may be implemented.

The design methodologies described in the preceding embodiments are embodied in software routines that may be implemented in a general purpose computer or workstation, or in a custom CAD system. One embodiment of a general purpose computer system 900 upon which the software routines may be stored and executed in shown in FIG. 9. Many other embodiments of a computer system may be used.

Computer system 900 includes a computer 928 that has a main memory 902, static memory 904, mass storage device 906, and processor 912 that communicate over one or more internal busses 910. Main memory 902 may be, for example, dynamic random access memory (DRAM) or other volatile or nonvolatile memory that store program code, system code, and/or one of more of the software routines of the various design methodology embodiments. Static memory 904 may be cache memory or be used to store program code, system code, and/or one of more of the software routines of the various design methodology embodiments. Mass storage device 906 may be any mass storage device such as a CDROM, floppy disk, hard disk, laser disk, flash memory card, magnetic storage device, or the like. Mass storage device 906 may also store program code, system code, and/or one of more of the software routines of the various design methodology embodiments. Processor 912 may be any control logic that coordinates the flow of data in computer system 928. For example, processor 912 may be a microprocessor or one or more other digital signal processing devices.

Computer 928 may communicate with one or more of peripheral devices 914 over bus 926. The peripheral devices includes a display 914 for displaying graphical representations of the logic and circuitry of the product and test die generated by the design methodologies and/or the software routines of the design methodologies; a keyboard 916 for inputting data into computer 928; a cursor control device 918 such as mouse, trackball, or stylus; a signal generation device 920 for providing any other input signal to computer 928; a hard copy device 922 such as a printer; and a sound recording and playback device 924.

SPECIAL CONTACT PADS

With reference to FIGS. 3 and 4, special contact or special contact pads 310 provide a means for test circuits 420, 404, and 406 to provide test input data to, and monitor signals from, product circuits 302, 304, and 306, respectively without having to test the function of the entire product circuit 300. Throughout the remainder of this section, reference will be made to special contact pads 310 and bond pads 312, however, the same description may apply equally to special contact pads 410 and bond pads 412, respectively.

Special contact pads 310 also provide a means for testing internal circuits 302–306 when these circuits are not otherwise individually testable and/or accessible through bond pads 312. For one example, product circuit 302 may be an embedded memory that is not directly accessible through bond pads 312. Address and input data signals may be provided over several of the special contact pads 310 to provide test patterns to the embedded memory, and another group of special contact pads 310 may receive data read from the memory. The external circuitry providing the test patterns for the embedded memory may provide any number of patterns to increase the fault coverage.

For another embodiment, product circuit 302 may be a programmable circuit such as nonvolatile memory or programmable logic. Data can be programmed into the internal circuit through the special contact pads 330. For example, BIOS information, program code, and system software may be programmed or updated in programmable circuit 302 after fabrication of integrated circuit 300.

As shown in product die 300, special contact pads 310 may also work with BIST circuitry 308 (or other on-chip test circuitry) to monitor the response of internal circuit 306 to test stimuli provided by BIST 308. This can be accomplished without having to add additional bond pads 312, or to use existing bond pads 312 to communicate with BIST 308.

As shown in FIG. 3, special contact pads 310 are disposed within a region surrounded by peripheral bond pads 312. As special contact pads 310 are not disposed in the predetermined peripheral alignment of bond pads 312, the size of product die 300 may not be increased by adding special contact pads 310. For other embodiments, the number and placement of special contact pads 310 may increase the size of product die 300.

Special contact pads 310 may also be interspersed between bond pads 312, or may be located outside the region surrounded by bond pads 312. For one embodiment in which special contact pads 310 are interspersed between bond pads 312, it may be advantageous for special contact pads 310 to be smaller than bond pads 312 so as not to increase the size of product die 300.

Special contact pads 310 may be any size including sizes smaller than bond pads 312. When special contacts 310 are smaller than bond pads 312, more special contact pads may be disposed on product die 300 without increasing the size of the die over that defined by the peripheral bond pads 312. A larger number of special contact pads may increase the number and/or complexity of tests that can be provided to the internal circuit, and thus may increase the fault coverage and robustness of tests. For one embodiment, a bond pad 312 may be approximately 100 $\mu$m×100 $\mu$m (4 mil×4 mil), and a special contact pad may be approximately 5 to 10 $\mu$m per side. In other embodiments, the special contact pad may be less than 5 $\mu$m per side. For still other embodiments, the special contact pads may be manufactured to have different sizes to accommodate their different spatial locations on the die (e.g., between bond pads 312 vs. within the area surrounded by bond pads 312), to accommodate different dimensions of various probe tips, bond wires, or solder balls, or to accommodate different functions of the circuits under test (i.e., nodes driving output signals may required larger pads than pads for providing input signals, or vice versa). The lower limit for the size of the special contact pads may be limited by the accuracy of the probe-to-pad alignment and the size of the probe.

Special contact pads 310 may be formed into an approximately square shape, rectangular shape, or any other geometric shape. Special contact pad 310 may also have a height different than that of bond pads 312. Special contacts pads 310 may be fabricated using conventional photolithography processes that are typically used to create bond pads or other relatively flat conductive landings. For one embodiment, the special contact pads may be fabricated from one or more metal layers including aluminum, copper, gold, or other metals or conductive materials.

Figure 10:
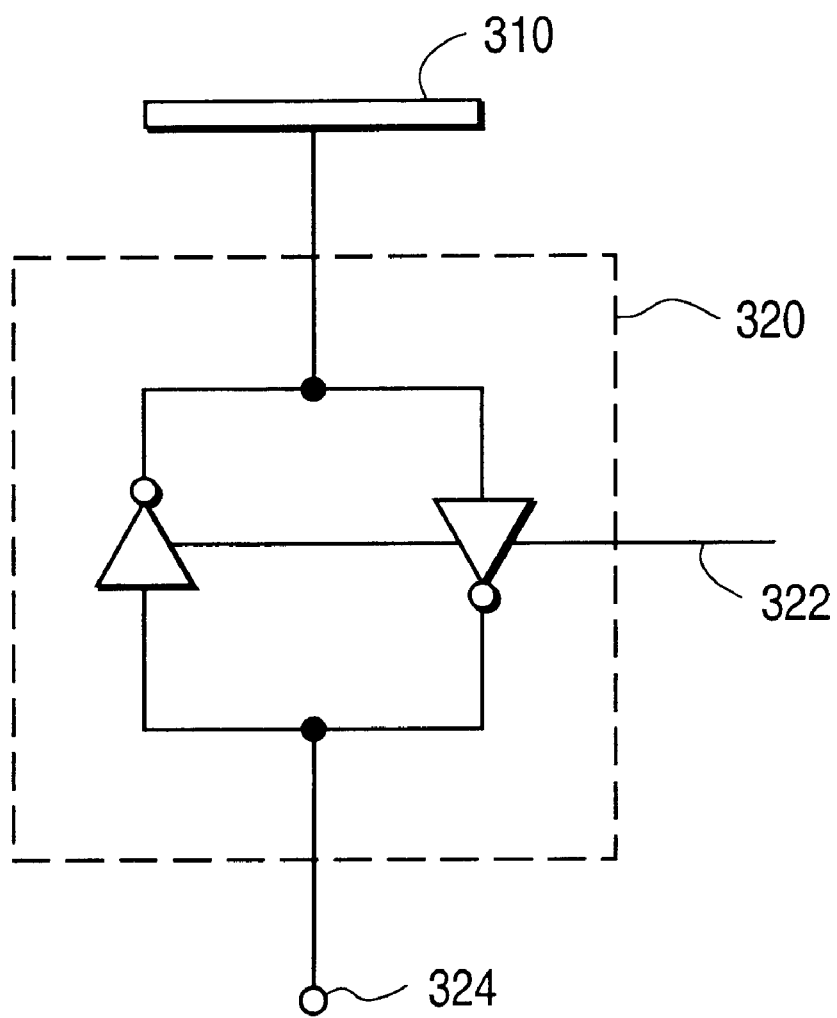
FIG. 10 is a logic diagram of one embodiment of a special contact pad coupled to an internal circuit node via a bidirectional buffer.

Special contact pads 310 may not be permanently bonded out to an integrated circuit package (e.g., typical plastic and ceramic chip packages); rather, the pads may be used for receiving test input information (e.g., address, control or data signals), or for monitoring internal test nodes or signals. The special contact pads are large enough, however, to receive an electrical contact element (as will be described in more detail below). If special contact pads 310 are not bonded out to a package, special contacts pads 310 generally require significantly less supporting circuitry than is typically required by bond pads 312. Typical bond pads generally include supporting circuitry that requires significant amounts of silicon die are. Examples of the supporting circuitry include electrostatic-discharge (ESD) protection structures such as resistors, capacitors, and/or diodes, latch-up prevention circuits such as guard rings, buffers for driving circuits and signal lines external to the integrated device or for buffering internal signals received from external signal lines, logic or voltage translation circuits, and noise reduction circuitry. Special contact pads 310 may reduce the amount of supporting circuitry required. Little no ESD protection may be needed and little or no buffering may be required for an external probe to electrically contact a special contact pad and monitor a signal thereon. For one example, an I/O buffer 320 may be used between an internal test point 324 and a special contact pad 312 as shown in FIG. 10. The I/O buffer may be controlled by a control signal 322. The I/O buffer 320 may be approximately 10 to 100 times weaker than that required for a bond pad having to drive heavy loads in a PCB environment. Additionally, little or no latch-up supporting circuitry or noise reduction circuitry may be required. For example, a weak pull-up resistor may be all that is required for each special contact pad for noise reduction circuitry. Generally, a special contact pad may require only 1 to 50 percent of the supporting circuitry typically required for a bond pad.

Figure 11:
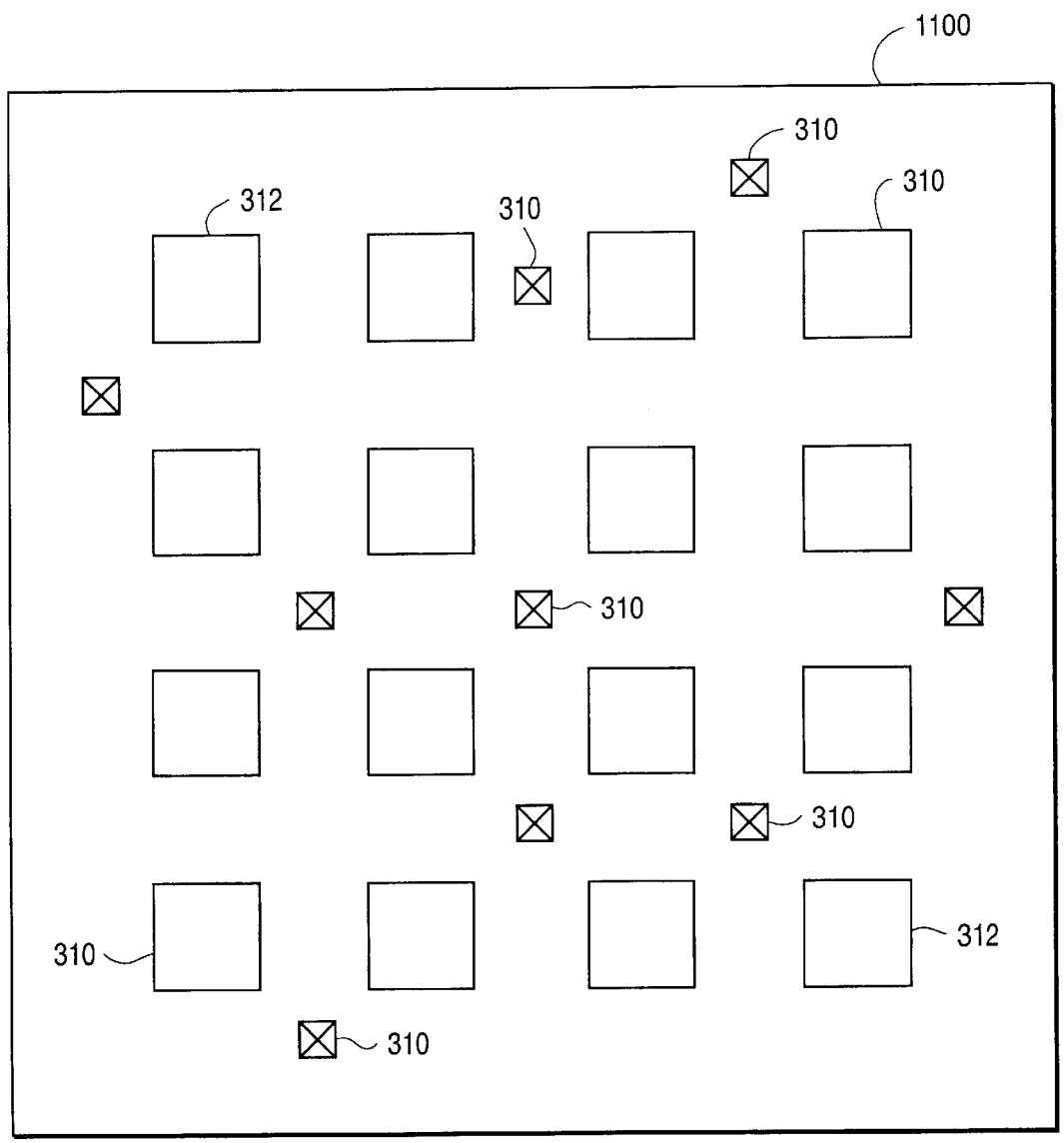
FIG. 11 is a plan view of one embodiment of an integrated circuit having bond pads aligned in a grid pattern, special contact pads not aligned in the grid pattern, and special contact pads aligned in the grid pattern.

While FIGS. 3 and 4 show that special contact pads 310 and 410 are disposed within a region surrounded by peripherally located bond pads 312 and 412, special contact pads may also be included within other product or test die layouts. FIG. 11 shows an integrated circuit 1100 (either a product die or product die) that includes bond pads 310 aligned in a LGA pattern for bonding to contact balls (e.g., solder or other metal interconnect) in a C4 or flip-chip arrangement. Selectively dispersed within and outside of the grid pattern are special contact pads 310. In this embodiment, special contact pads 310 may be smaller than the bond pads 312 or contact balls so as not to increase the size of integrated circuit 1100 over the minimum size required for a given number of bond pads 312. In alternative embodiments, the special contact pads 310 may be the same size as bond pads 312.

Figure 12:
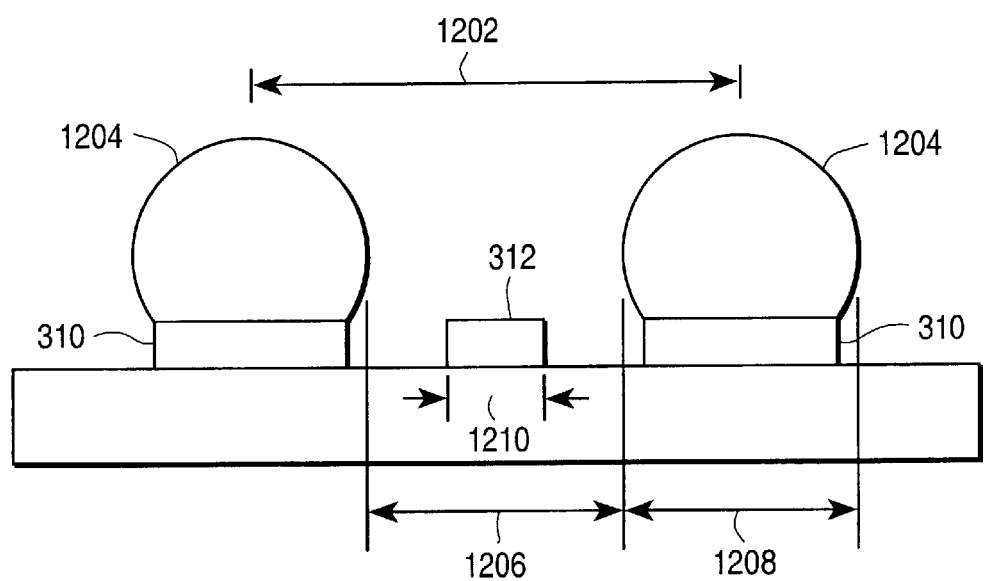
FIG. 12 is a side cross-sectional view of a special contact pad disposed between two bond pads with contact balls.

FIG. 12 shows a side cross-sectional view of a special contact pad 310 disposed between two bond pads 312. Bond pads 312 have contact balls 1204 formed thereon, and are typically spaced with a minimum pitch 1202 between their centers of approximately 10 mils (0.010") or 250 μm. The minimum diameter 1208 of the contact balls 1204 is typically on the order of the 1 to 3 mils, and the minimum distance 1206 between the edges of contact balls 1204 is typically on the order of 7 to 9 mils. Special contact pad 310 can be sized to fit between bond pads 312, and may have a width 1210 of less than 9 mils. For other embodiments, special contact pad 310 may have a width of approximately 1 to 5 mils. For still other embodiments, special contact pad 310 may have a width of less than 1 mil. Special contact pad 310 may be formed into an approximately square shape, rectangular shape, or any other geometric shape. Special contact pad 310 may also have a height different than that of bond pads 312.

The embodiments shown in FIGS. 11 and 12 may also be a LGA package such as BGA package, PGA package, C4 package, or flip chip package that has pins or contact balls for interfacing with a socket or printed circuit board (PCB). Special contact pads 310 may be additional pins or pads that can receive test signals or provide test output signals or other signals to probes, a socket, or PCB.

FIG. 12 also illustrates a special contact pad 310 disposed between two bond pads 312 arranged in a peripheral alignment (as shown in FIG. 3). Contact balls 1204 need not be formed on bond pads 312.

Figure 13:
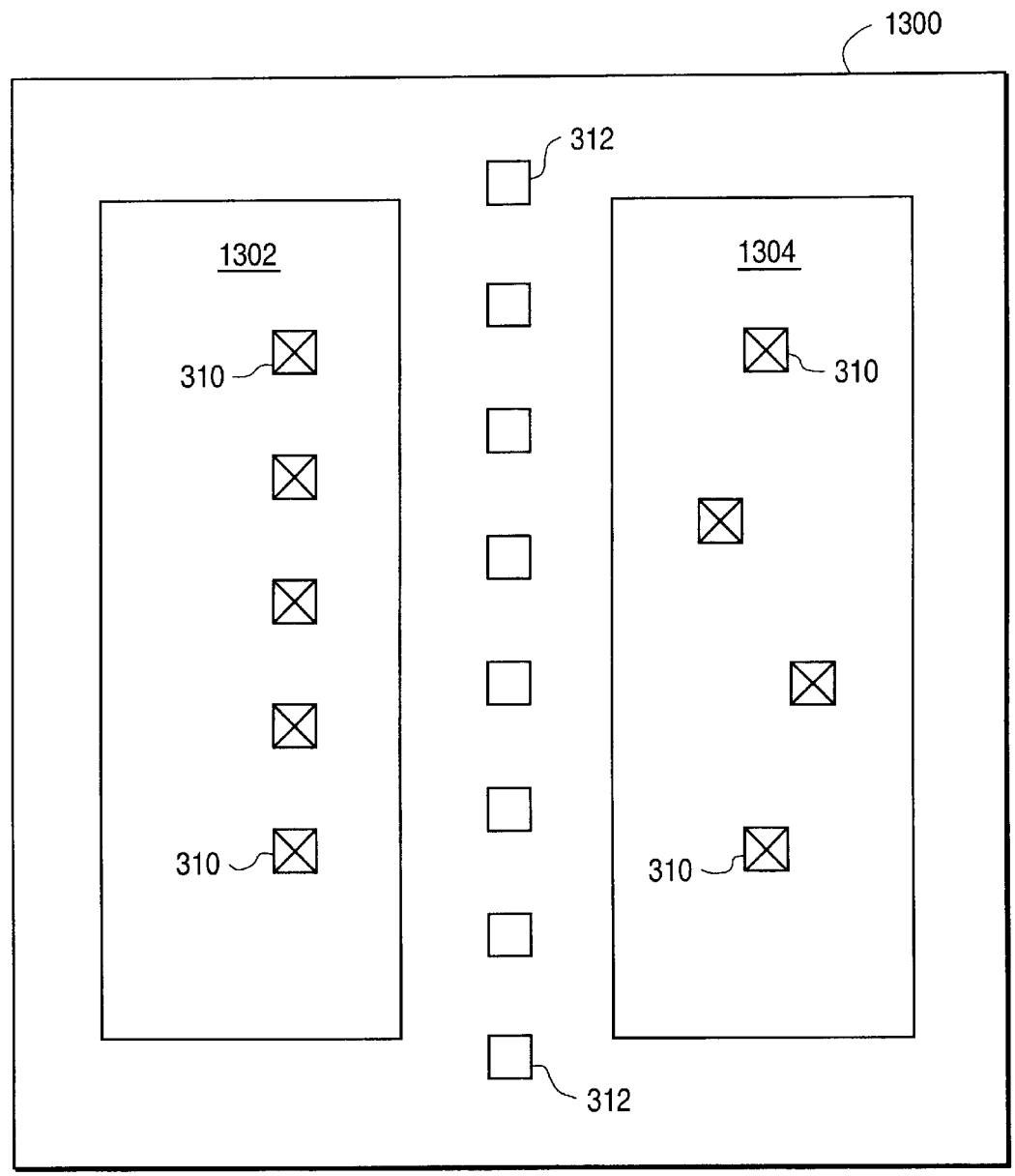
FIG. 13 is a plan view of one embodiment of an integrated circuit having lead-on-center bond pads, internal circuitry, and special contact pads for testing the internal circuitry.

FIG. 13 shows an integrated circuit 1300 (either a product die or test die) that includes bond pads 312 arranged as a column (or row) in a lead-on-center pattern. Selectively dispersed within and outside of the lead-on-center pattern are special contact pads 310 that, as in previous embodiments, may be used to provide test signals to or monitor signals from internal circuits 1302 and 1304 of integrated circuit 1300.

Figure 14:
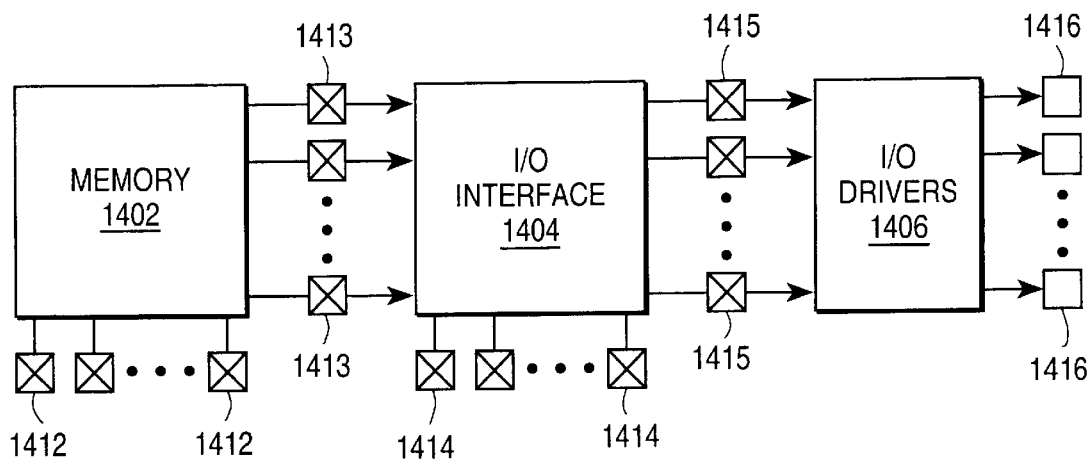
FIG. 14 is block diagram of one embodiment of sequential circuit blocks and special contact pads for testing the sequential circuits.

FIGS. 3–4 show that product circuit blocks or internal circuit nodes can be tested or monitored by special contact pads. FIG. 14 shows that sequential product circuits 1402, 1404, and 1406 can also be tested by special contact pads with or without the use of bond pads. In this embodiment, test input data is provided from test circuitry on a test die to special contact pads 1412 and embedded memory 1402. For an alternative embodiment, the input data can be provided from bond pads. The test data may include an address, control signals (e.g., read, write, etc.), and/or a test pattern. Assuming that the test data is an address of a location within memory 1402, data stored at the accessed address may be provided to I/O interface 1404 and monitored by special contact pads 1413. The access time (i.e., address to data out) of memory 1402 may be more accurately measured by special contact pads 1412 and 1413 as no additional time is introduced due to circuit blocks such as I/O interface 1404 and I/O drivers 1406. Conventional approaches of using BIST circuitry would typically include additional on-chip circuitry to provide address signals, for example, to memory 1402, and then external circuitry could monitor the results at one or more of bond pads 1416. This conventional approach, however, would be unable to monitor the outputs of memory 1402 directly (as with special contact pads 1413) and thus would not be able to directly measure the actual access time of memory 1402.

In response to the data read from memory 1402, I/O interface 1404 may format the data prior to providing it to I/O drivers 1406. I/O interface 1404 may receive control signals on special contact pads 1414, or internal circuit nodes within I/O interface 1404 may be monitored by special contact pads 1414. The data output by I/O interface 1404 to I/O drivers 1406 may be monitored via special contact pads 1415. I/O drivers 1406 may then drive the data to bond pads 1416.

Since special contact pads 1413 and 1415 and bond pads 1416 may be used to monitor the output of each of memory 1402, I/O interface 1404, and I/O divers 1406, respectively, such that incorrect data received at bond pads 1416 can be isolated to the circuit which caused the failure. In conventional BIST techniques in which an address, for example, is provided to memory 1402, the source of incorrect data received at bond pads 1416 would be unknown.

While the embodiment shown in FIG. 14 includes a specific example of accessing data in an embedded memory 1402, the example also applies to introducing and monitoring signals from a series of any other circuit blocks.

Figure 16:
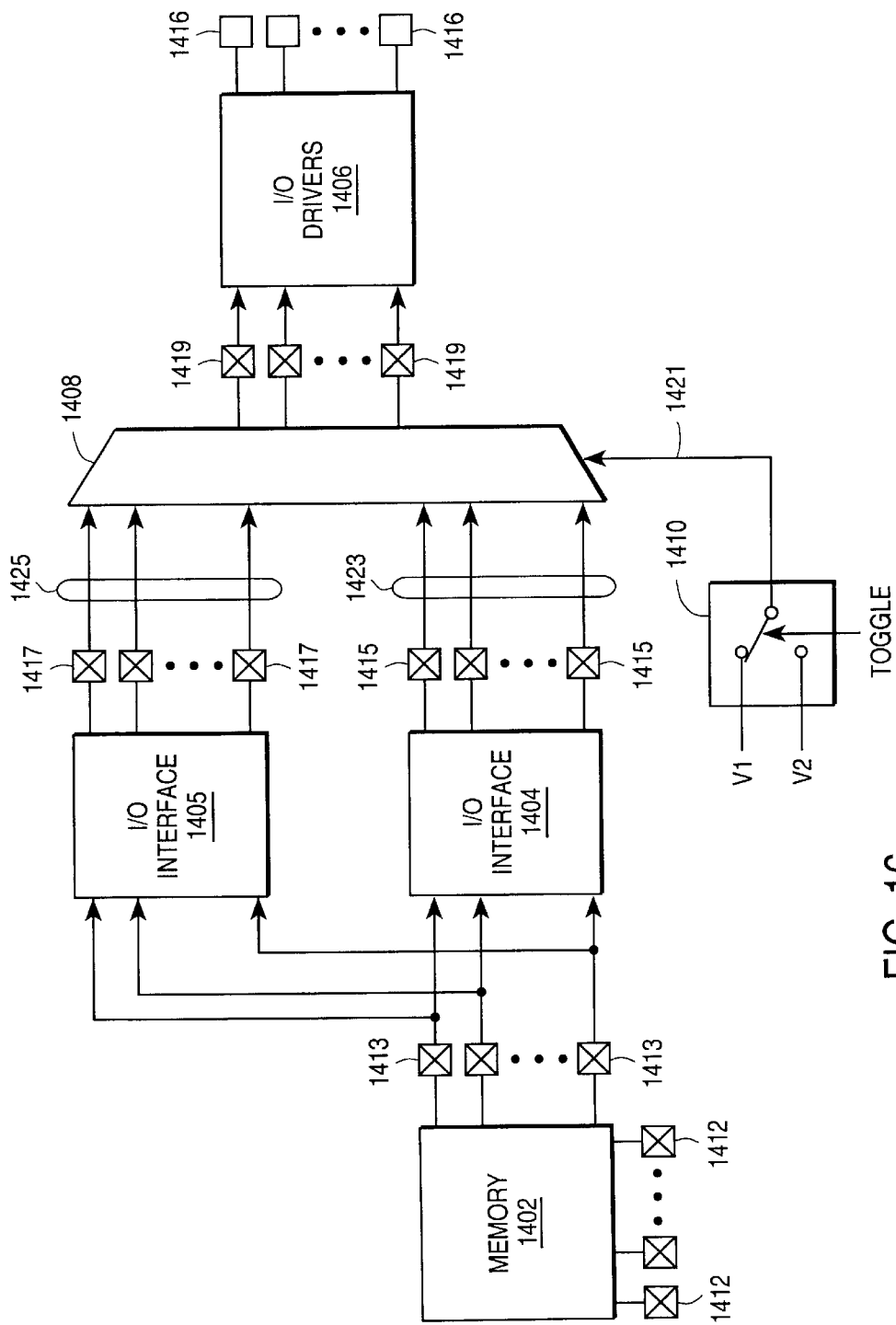
FIG. 16 is a block diagram one embodiment of using special contact pads to isolate a faulty circuit block and enable a redundant circuit block.

Special contact pads may also be used to not only isolate failures, but to also enable redundant circuits to be used to replace faulty circuits. FIG. 16 shows one embodiment of test circuitry on a test die using special contact pads to identify faulty circuit blocks and enable a redundant circuit to replace the faulty circuit block. This embodiment again uses the example of accessing data in an embedded memory, but can be extended to a series of circuits in which one of the circuits has a redundant circuit.

FIG. 16 includes a redundant I/O interface 1405 that can replace a defective I/O interface 1404. The outputs of memory 1402 are provide to both of I/O interfaces 1404 and 1405. The outputs of I/0 interface 1404 can be monitored by a test die through special contact pads 1415, and the outputs of redundant I/O interface 1405 can be monitored by a test die through special contact pads 1417. If the outputs of I/O interface 1404 are as expected indicating that I/O interface 1404 is operating correctly, multiplexer 1408 is configured by the control signal on line 1421 to allow the signals on lines 1423 to be provided to I/O drivers 1406. If, however, the outputs of I/O interface 1404 are not as expected indicating that I/O interface 1404 is malfunctioning, and the outputs of redundant I/O interface 1405 are as expected, then multiplexer 1408 is configured by the control signal on line 1423 to allow the signals on lines 1425 to be provided to I/O drivers 1406. The signals output by multiplexer 1408 may be monitored via special contact pads 1419.

The control signal on line 1423 can be driven to the appropriate voltage level or logic state by switch 1410. In response to a TOGGLE signal, either voltage V3 or V2 will be selected in response to monitoring the signals at the special contact pads 1417 and 1415. The TOGGLE signal can be controlled by test circuitry on a test die through another special contact pad or bond pad.

Figure 15:
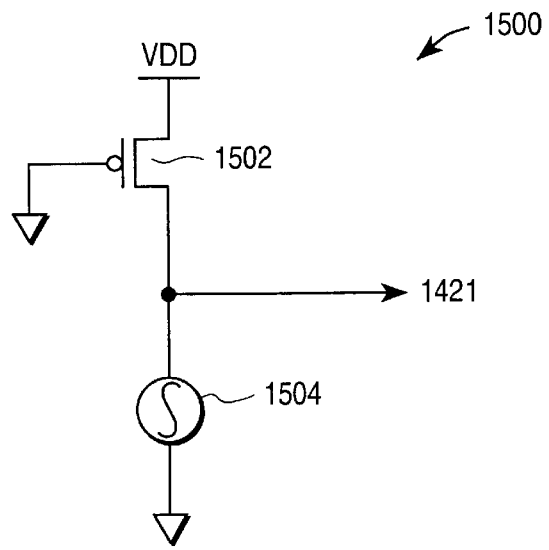
FIG. 15 is a circuit diagram of one embodiment of the switch of FIG. 16.

FIG. 15 shows switch 1500 that is one embodiment of switch 1410 of FIG. 16. Other embodiments of switch 1410 may also be used. Switch 1500 includes a PMOS transistor biased into an on-state by having its gate coupled to ground, its source coupled to a power supply VDD, and its drain coupled to signal line 1421. Switch 1500 also includes a fuse element 1504 that is coupled between signal line 1421 and ground. The fuse element may be a metal fuse, resistive fuse, or memory element. When fuse 1404 is blown in response to the TOGGLE signal, signal line 1421 is pulled towards VDD and the signals on lines 1425, for example, are output by multiplexer 1408. When fuse 1504 is not blown, signal line 1421 is pulled towards to ground by fuse 1504 and the signals on lines 1423, for example, are output by multiplexer 1408. Fuse 1504 may be blown using several well-known techniques including using a laser pulse or electrical currents. For one embodiment, a special contact pad may be used to provide an electrical current that blows fuse 1504.

Figure 17:
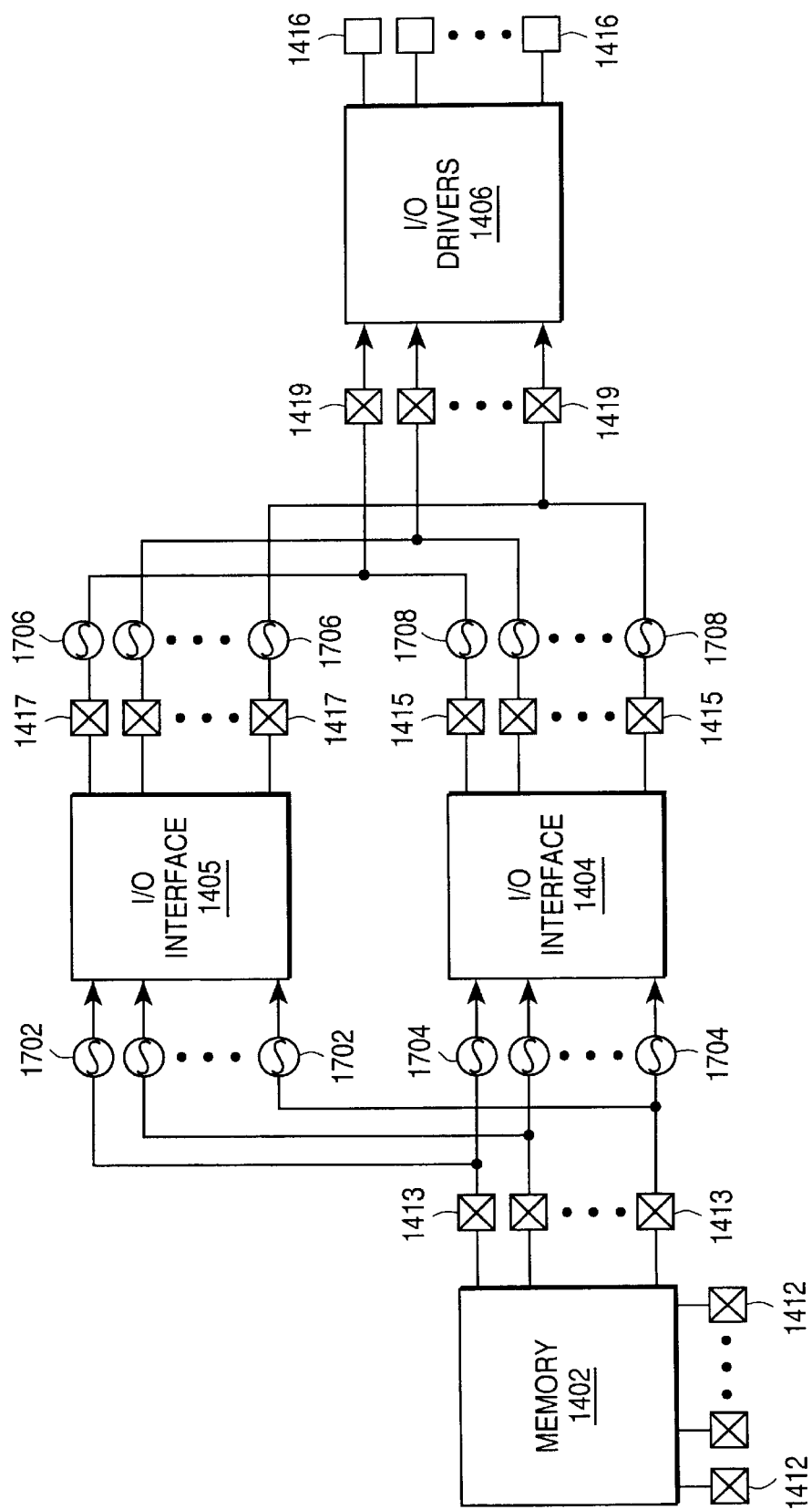
FIG. 17 is a block diagram of another embodiment of using special contact pads to isolate a faulty circuit block and enable a redundant circuit block.

FIG. 17 shows an alternative embodiment of the redundancy scheme of FIG. 16. In FIG. 17, groups of fuses 1702, 1704, 1706, and 1708 may be included before and after the I/O interfaces. When one of the I/O interface is identified as defective it may be isolated by an appropriate fuse group. For example, if I/O interface 1404 is defective and I/O interface 1405 is functioning correctly, then fuse groups 1704 and 1708 may be blown so as to isolate I/O interface 1404. The fuse groups 1704 and 1708 may be blown via special contact pads (not shown) that provide one or more signals that cause a large amount of current to flow through fuse groups 1704 and 1708. Alternative means to blow the fuses may also be used.

Figure 18:
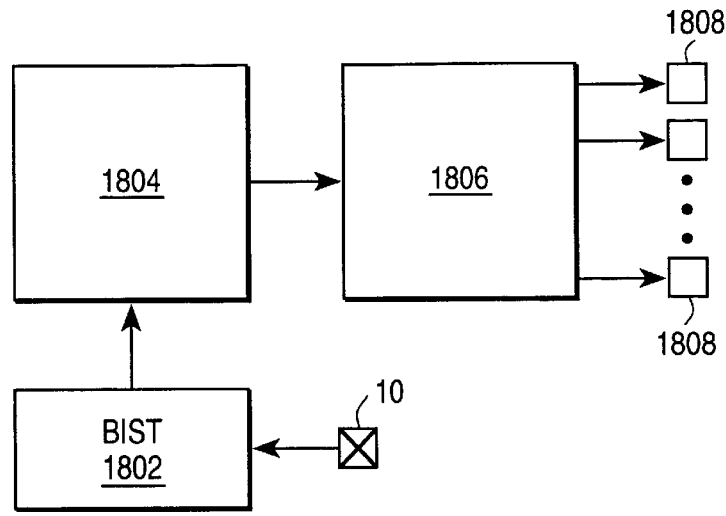
FIG. 18 is a block diagram of one embodiment of using a special contact pad to enable or stimulate a circuit under test.

As discussed above with respect to FIG. 3, special contact pads can be used together with on-chip test circuitry to test a product circuit. FIG. 18 shows one embodiment in which one (or more) special contact pad 1810 is used to provide a clock signal, reset signal, enable signal, or other control signal to BIST 1802. In response, BIST 1802 provides one or more test signals to internal circuit 1804 and/or internal circuit 1806. The results of the internal test may then be monitored at bond pads 1808 (or alternatively at other special contact pads). For other embodiments, a special contact pad may also be used to provide an enable signal or a clock signal to any other internal circuit.

Figure 19:
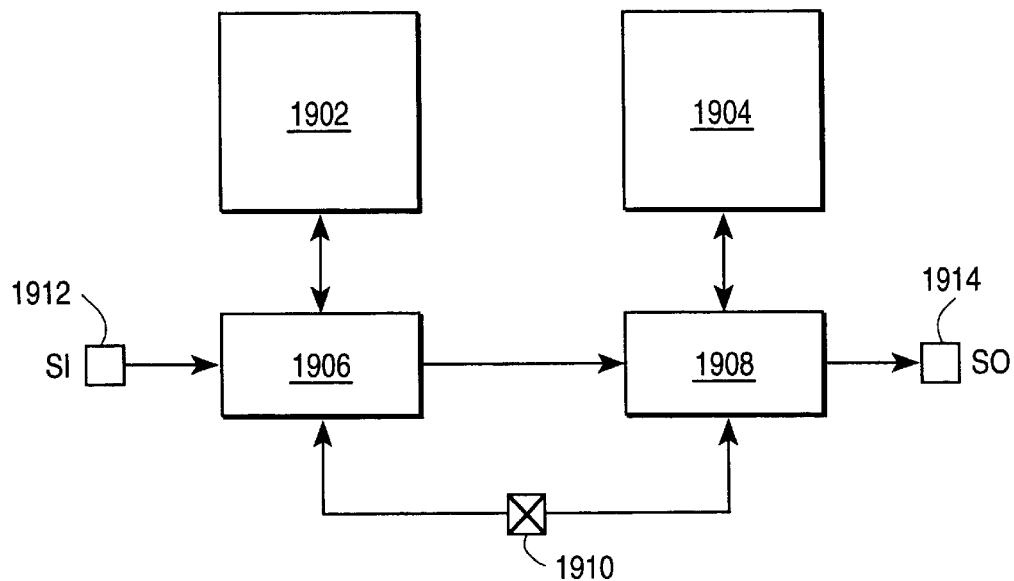
FIG. 19 is a block diagram of one embodiment of using a special contact pad to provide a control signal to scan circuitry.

Similarly, as shown in FIG. 19, one (or more) special contact pad 1910 may be used to provide a clock signal, reset signal, enable signal, or other control signal to shift register elements 1906 and 1908 of a SCAN circuit. The SCAN circuit may be coupled between bond pads 1906 and 1908 (or, alternatively, one or more special contact pads) that may receive SCAN input data SI and provide SCAN output data SO, respectively.

For an alternative embodiment, one or both of pads 1212 may be special contact pads. This may provide for increased design flexibility in the location and use of SCAN circuitry. For example, this may enable multiple SCAN regions or circuits of varying size and complexity to be used to test various different internals circuits or blocks of circuitry.

TEST METHODOLOGY AND TEST ASSEMBLIES

A test die generated by one of the design methodologies described above, may be used to test or monitor signals of a product die using various test assemblies.

Figure 20:
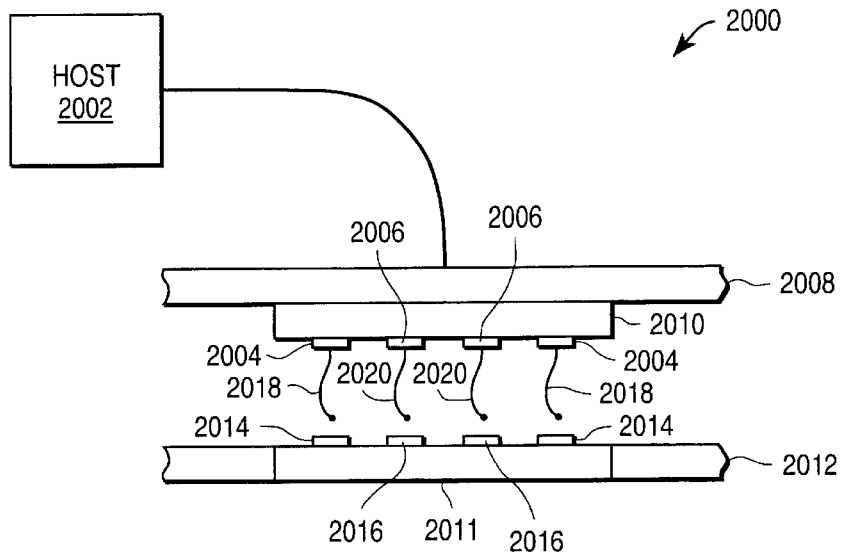
FIG. 20 is a side cross-sectional view of a test assembly for testing a product die.

FIG. 20 illustrates a side cross-sectional view of one embodiment of a test assembly 2000 for performing a wafer-level sort test of a product die 2011 by a test die 2010. Product die 2011 may be product die 300 of FIG. 3, and test die 2010 may be test die 400 of FIG. 4.

Test assembly 2000 includes an interconnect and support substrate 2008, test die 2010, and product die 2012. Interconnect and support substrate 2008 provides electrical interconnect between test die 2010 and host 2002. Substrate 2008 also provides structural support for test die 2010. Substrate 2008 may be one or more printed circuit boards (PCBs) that perform the electrical interconnect and support functions. Substrate 2008 may be attached to a structure (e.g., a wafer prober or chuck not shown) that also supports wafer 2012.

Host 2002 communicates with test die 2010 via substrate 2008. Host 2002 may send signals to start and stop tests, to catalog results of tests and display them to a user, or to send other test data to test die 2010. Any type of host may be used including a general purpose computer, ATE, or any other control logic.

Test die 2010 includes special contact pads 2006 and bond pads 2004 upon which are disposed spring contact elements 2020 and 2018. Product die 2011 is formed on a wafer 2012 that may include other product die 2011. Wafer 2012 may be disposed on a suitable support structure such as a vacuum chuck (not shown).

Spring contact elements 2018 are formed in a predetermined alignment to provide electrical connections between bond pads 2004 and bond pads 2014 when test die 2010 is urged toward product die 2012. Spring contact elements 2020 provide electrical connections between special contact pads 2004 and special contact pads 2016 when test die 2010 is urged toward product die 2012. For one embodiment, contact elements 2018 may be arranged in a grid array to contact bond pads 2014 arranged on die 2011 in a corresponding grid array pattern. Spring contact elements 2020 may be arranged aligned in the predetermined grid array, outside of the grid array pattern, or interspersed within the grid array pattern to make electrical contact with corresponding special contact pads 2016 on die 2011.

Alternatively, spring contact elements 2018 may be arranged in a peripheral pattern to contact bond pads 2014 arranged on die 2011 in a corresponding peripheral pattern. Spring contact elements 2020 may be arranged aligned within the predetermined peripheral pattern, outside of the peripheral pattern, or within a region surrounded by the peripheral pattern to make electrical contact with corresponding special contact pads 2016 on die 2011. In yet another embodiment, spring contact elements 2018 may be arranged in a lead-on-center arrangement to align with corresponding lead-on-center bond pads 2014, and spring contact elements 2020 may be arranged within or outside of the lead-on-center arrangement to align with corresponding special contact pads 2016. For still other embodiments, bond pads 2014 and special contact pads 2016 may be arranged in any other alignment.

Figure 21:
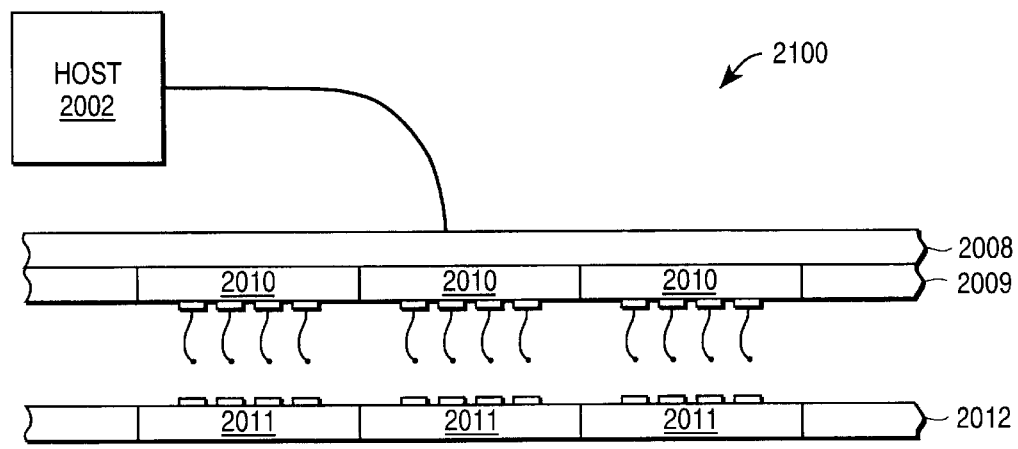
FIG. 21 is a side cross-sectional view of a test assembly for testing multiple product die on a wafer under test.

When test die 2010 is urged towards, and makes contact with, product die 2011, one or more of the product circuits may be simultaneously or consecutively tested by test circuitry of test die 2010. Product die 2011 may also be tested as a whole. Wafer 2012 may include many product die 2011 and test die 2010 may be stepped across wafer 2012 to test each product die. In an alternative embodiment shown in FIG. 21, multiple test die 2010 may be used in parallel to test multiple product die 2011 on wafer 2012 to increase testing throughput. The testing methodology of FIG. 21 may be extended such that a wafer 2009 of test die simultaneously tests a wafer 2012 of corresponding product die.

While FIG. 20 shows that test die 2010 includes contact elements 2018 and 2020 to communicate with both bond pads 2014 and special contact pads 2106, respectively, multiple independent test die may be used for probing special contact pads 2016 and/or bond pads 2014. For example, a first test die 2010 including bond pads 2018 with attached spring contact elements 2018 may initially be used to contact bond pads 2014 of product die 2011. The first test die may functionally test product die 2011 as a whole. Subsequently, a second test die 2010 may be used that includes special contact pads 2006 and spring contact elements 2020. The second test die may be used to test, simultaneously or consecutively, one or more of the product circuits of product die 2011. In other embodiments, multiple test die may be used that have a mixture of spring contact elements 2018 and 2020. The number of test die, and the configuration of the test die, is determined by one or more of the design methodologies described above.

Figure 22:
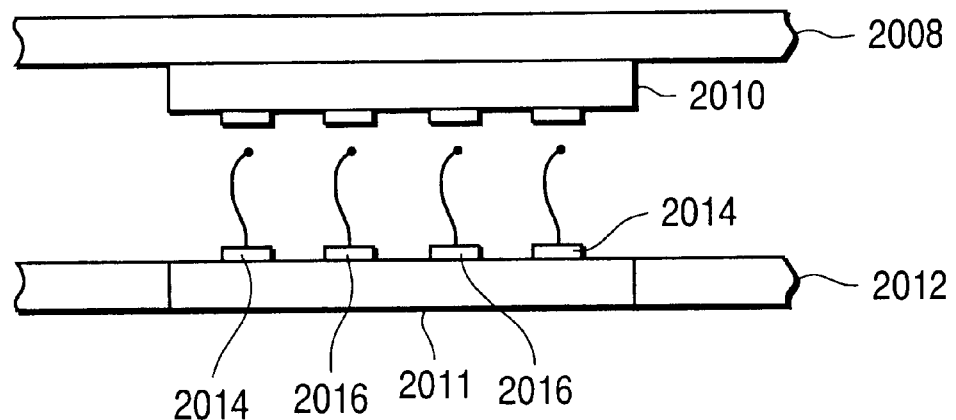
FIG. 22 is a side cross-sectional view of another embodiment of a test assembly including spring contact elements attached to a product die.
Figure 23:
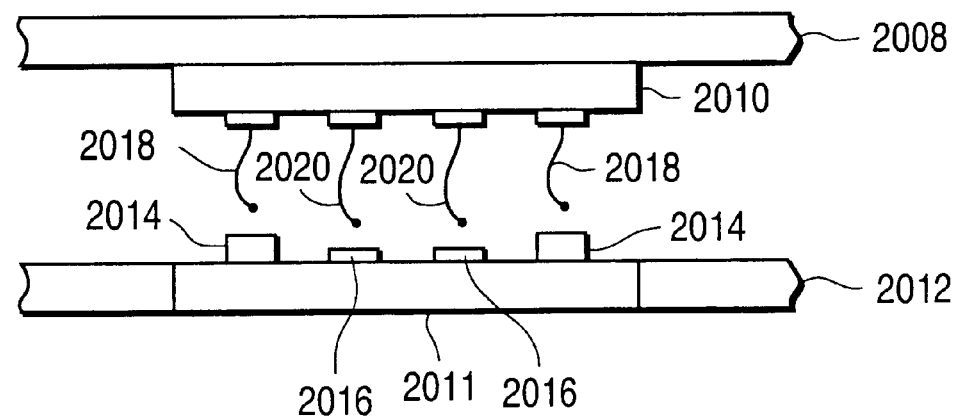
FIG. 23 is another embodiment of test assembly in which the spring contact elements, the bond pads, and the special contact pads have varying heights.

For an alternative embodiment, as shown in FIG. 22, spring contact elements 2018 and 2020 may be attached to bond pads 2014 and special contact pads 2016 on die 2011. For yet another embodiment, some of the spring contact elements 2018 or 2020 may attached to test die 2010 and some may be attached to die 2011.

Bond pads 2016 and special contact pads 2016 may also be of different heights. For example, as shown in FIG. 22, bond pads 2014 may be taller than special contact pads 2016 (or vice versa). For this embodiment, probes 2018 and 2020 are extended to different depths (or have different heights). That is, probes 2020 may extend lower than probes 2018 to make contact with special contact pads 2016. For yet another embodiment, bond pads 2004 and special contact pads 2006 of test die 2010 may be of different heights.

Figure 24:
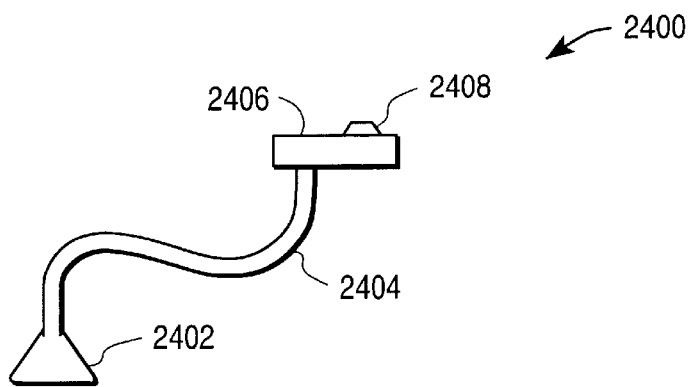
FIG. 24 is a side cross-sectional view of one embodiment of a spring contact element.

FIG. 24 shows a side cross-sectional view of spring contact element 2400 that is one embodiment of the spring contact elements 2018 and 2020 of FIGS. 20–23. Spring contact element 2400 includes a base 2402, elongated resilient member 2404, an elongated contact tip structure 2406, and a pyramid-shaped contact feature 2408. Many other embodiments of spring contact elements may be used including those disclosed in commonly-owned, co-pending U.S. application Ser. No. 08/526,246 filed on Sep. 21, 1995, commonly-owned, co-pending U.S. application Ser. No. 08/558,332 filed on Nov. 15, 1995, commonly-owned, co-pending U.S. application Ser. No. 08/789,147 filed on Jan. 24, 1997, commonly-owned, co-pending U.S. application Ser. No. 08/819,464 filed on Mar. 17, 1997, commonly-owned, co-pending U.S. application Ser. No. 09/189,761 filed on Nov. 10, 1998, which are all incorporated by reference herein.

Figure 25:
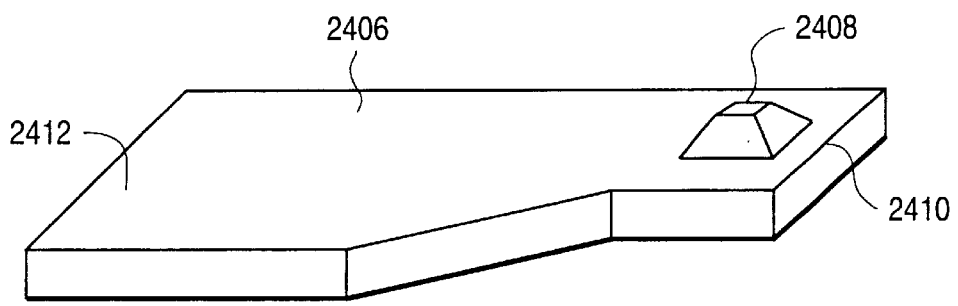
FIG. 25 is a perspective view of one embodiment of the contact tip structure and pyramid-shaped contact feature of the spring contact element of FIG. 24.

Structure 2406 can be any shape. FIG. 25 shows one embodiment of structure 25 which includes a relatively wider end for contacting to member 2404, and a relatively narrower end for supporting pyramid-shaped contact feature 2408.

Figure 26:
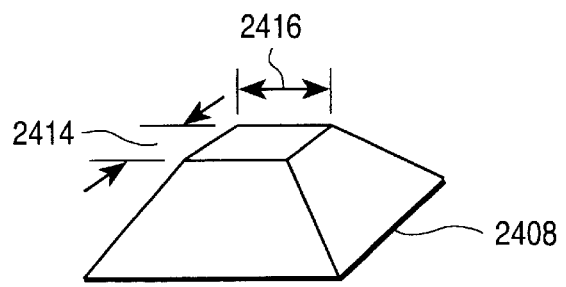
FIG. 26 is a perspective view of one embodiment of the pyramid-shaped contact tip structure of FIG. 25.

FIG. 26 shows one embodiment of pyramid-shaped contact feature 2408. Other shapes may be used. Feature 2408 may advantageously be significantly smaller than typical tungsten probe tips of cantilevered probes and contact balls of C4 of flip-chip probe card technologies. The tip of pyramid-shaped contact feature 2408 may have length 2414 and width 2416 dimensions of approximately 1 to 5 $\mu$m. For alternative embodiments, 2414 and 2416 may be submicron dimensions. The small size of contact 2408 may allow for special contact pads to be smaller than bond pads. As previously discussed, when the special contact pads are smaller that the bond pads, then the special contact pads can be added to an integrated circuit, such as product circuit 2011 without increasing the die size. Additionally, smaller special contact pads can be placed between bond pads of solder balls.

FIGS. 43A and 43B show side and perspective views, respectively, of another embodiment of a spring contact element disclosed in U.S. application Ser. No. 09/189,761. Spring contact element 4300 is coupled to a substrate 4306 and includes an elongated resilient member 4304, tip structure 4308, and blade 4302. Blade 4302 is used to make electrical contact to bond pads or special contact pads. Blade 4302 may advantageously be used to provide a good electrical connection to contacted bond or special contact pads as blade 4302 may cut, slice, or otherwise penetrate the top surface of the pad. Blade 4302 may be disposed substantially horizontally on tip structure 43A, or in any other orientation.

FIGS. 44A and 44B show perspective and side views, respectively, of another embodiment of using blades on tip structures of spring contact elements. Blade 4400 is a multi-height blade disposed on tip structure 4406. Blade 4400 has a primary blade 4402 toward the front edge of tip structure 4406, and a trailing blade 4404 toward the back of tip structure 4406.

FIG. 45 shows a perspective view of another blade structure formed on a tip structure 4500. The blade of FIG. 45 is formed having a substantially rectangular base 4502 and a substantially triangular shape 4504.

Figure 27:
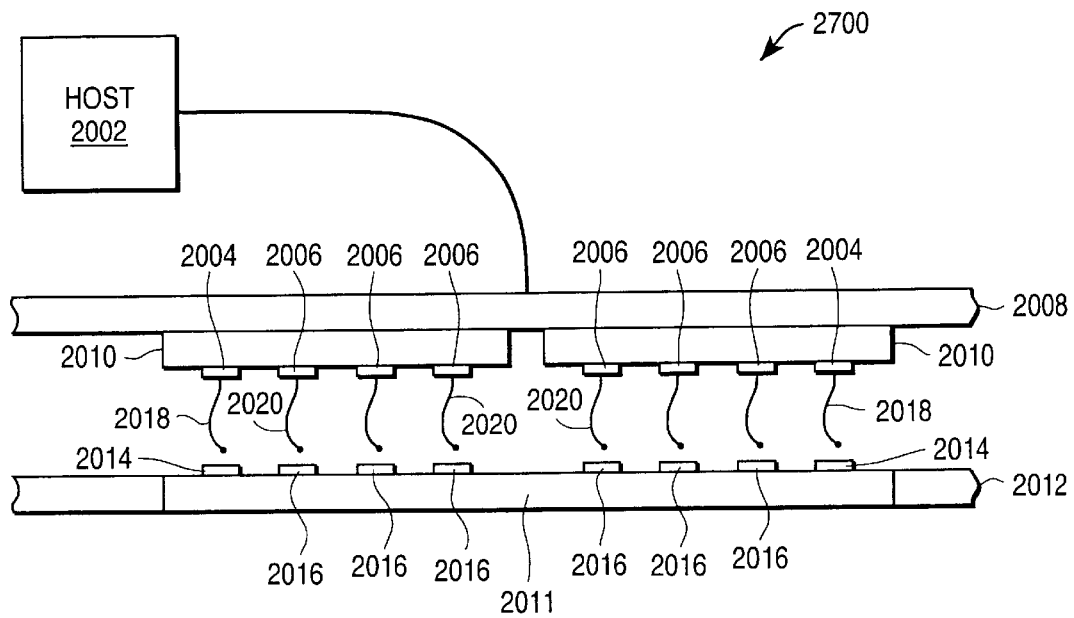
FIG. 27 is a side cross-sectional view of one embodiment of a test assembly including multiple test die for testing a single product die.

FIG. 27 shows test assembly 2700 that is another embodiment for performing a wafer-level sort test of product die 2011. In this embodiment, two (or more) test die 2010 may be used to simultaneously or consecutively test different product circuits of a single product die 2011. When using multiple test die to test a single product die, the physical mapping or location of bond pads 2014 and special contact pads 2016 are the primary determiners of which test die tests or monitors which product circuits of product die 2011. Each test die must contact all of the pads needed to perform tests by that test die.

The multiple test die of assembly 2700 may be generated by the design methodologies described above. For example, it may be determined (e.g., by software tool 608 of FIG. 6) that the test circuits required for testing product circuits of product die 2011 are best implemented in different process technologies (e.g., BiCMOS v. CMOS), and thus may generate different test die to support the test circuitry from the different process technologies. For another example, software tool 608 may determine that some of the requisite test circuits are best implemented in analog circuitry on the first test die, and other requisite test circuits are best implemented in digital circuitry on the second test die.

Figure 28:
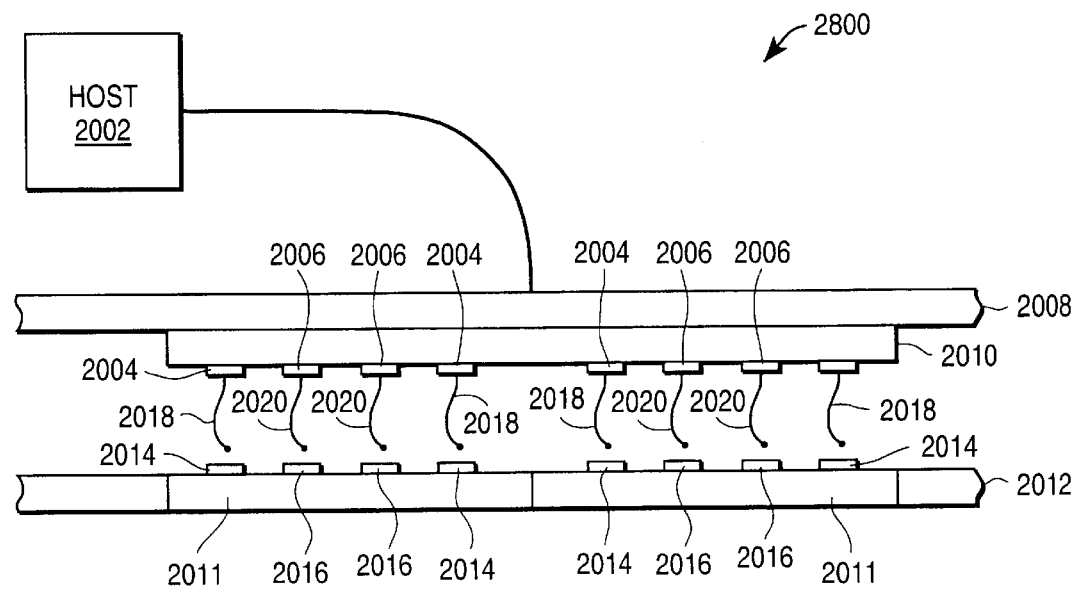
FIG. 28 is a side cross-sectional view of one embodiment of a test assembly including a single test die for testing multiple product die.

FIG. 28 shows another test assembly 2800 wherein two (or more) product die 2011 are tested by a single test die 2010. In this embodiment, the single test die may include tests that can be executed upon both product die (simultaneously or not). For one embodiment, test die 2010 may include one test circuit having multiple interconnection points or pads for providing duplicate signals to multiple product die 2011. For alternative embodiments, test die 2010 may include multiple duplicated test circuits for contacting multiple product die. Alternatively, each product die 2011 may include unique circuitry that can be tested by the single test die 2010.

Figure 29:
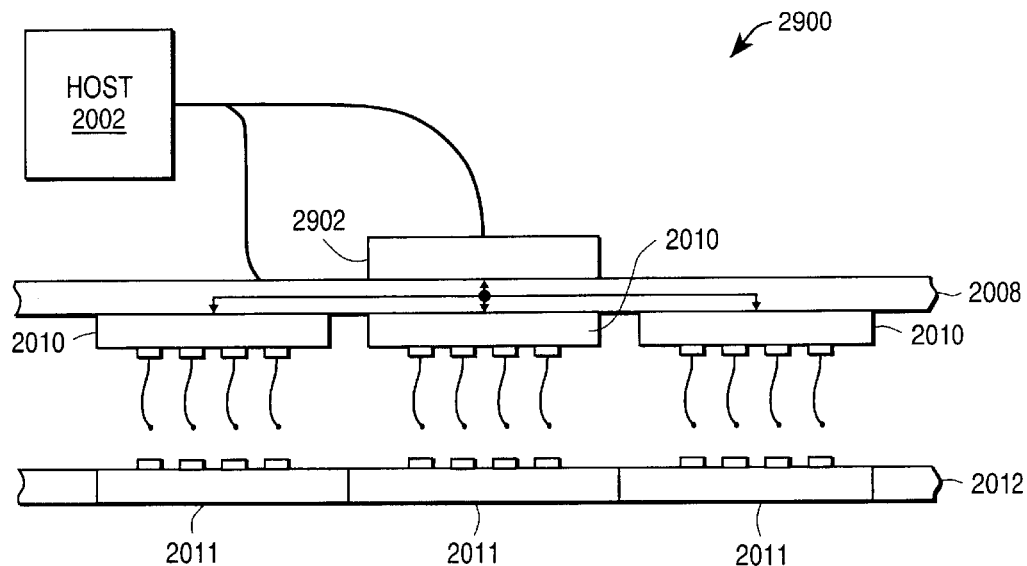
FIG. 29 is a side cross-sectional view of one embodiment of a test assembly including a test die that is shared by other test die.

Test assembly 2900 of FIG. 29 illustrates one embodiment of a hierarchical approach to test multiple product die 2011 with multiple test die 2010. As shown in FIG. 29, each product die 2010 may be tested by a separate test die 2010. Test die 2902 is a second level of hierarchy that communicates with host 2002 and supports or controls the multiple test die 2010. For example, test die 2902 may be a shared resource that includes circuitry that is commonly used by all of test die 2010. It may be advantageous to move this common circuitry to test die 2902 to, for example, decrease the size of the test die 2010. For example, an automatic pattern generator (APG) circuit or other test vector generation or storage circuitry may be moved to test die 2902 and shared by each of the multiple test die 2011. Test die 2010 may then simply include formatters, drivers, and timing generators for the patterns provided by test die 2902. The APG circuitry does not then have to be duplicated in each of test die 2010.

Test die 2902 may simultaneously support all test die 2010 by concurrently providing a common test pattern to each of test die 2010, or test die 2902 may perform a coordinating function and selectively (e.g., consecutively) provide tests or patterns to one or more of test die 2011.

The design methodologies described above may determine when it is advantageous to partition the test circuits into one or more test die. For example, if a relatively large circuit (e.g., an APG) can be shared by more than one test die, then the circuit can be moved to shared test die 2902 to reduce the die size of each test die 2010.

Figure 30:
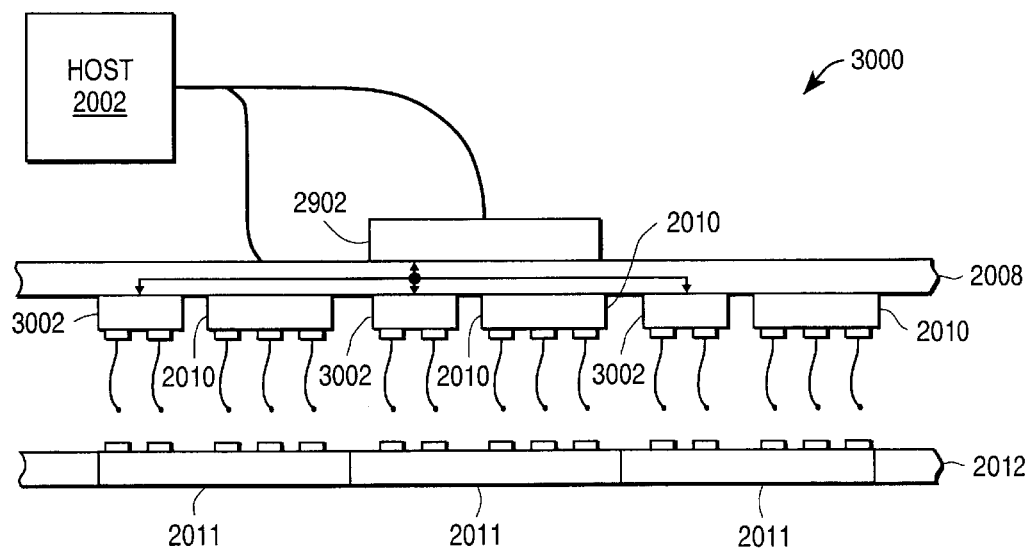
FIG. 30 is a side cross-sectional view of another embodiment of a test assembly including a test die that is shared by other test die.

FIG. 30 shows test assembly 3000 that also includes a shared test die 2902. In this embodiment, each test die 2010 is dedicated to a corresponding product die 2011 and may provide different tests to each product die. Test die 2902, however, may be used to simultaneously, or in a coordinated fashion, provide shared tests or test patterns to test die 3002 for use by each of product die 2011.

Figure 31:
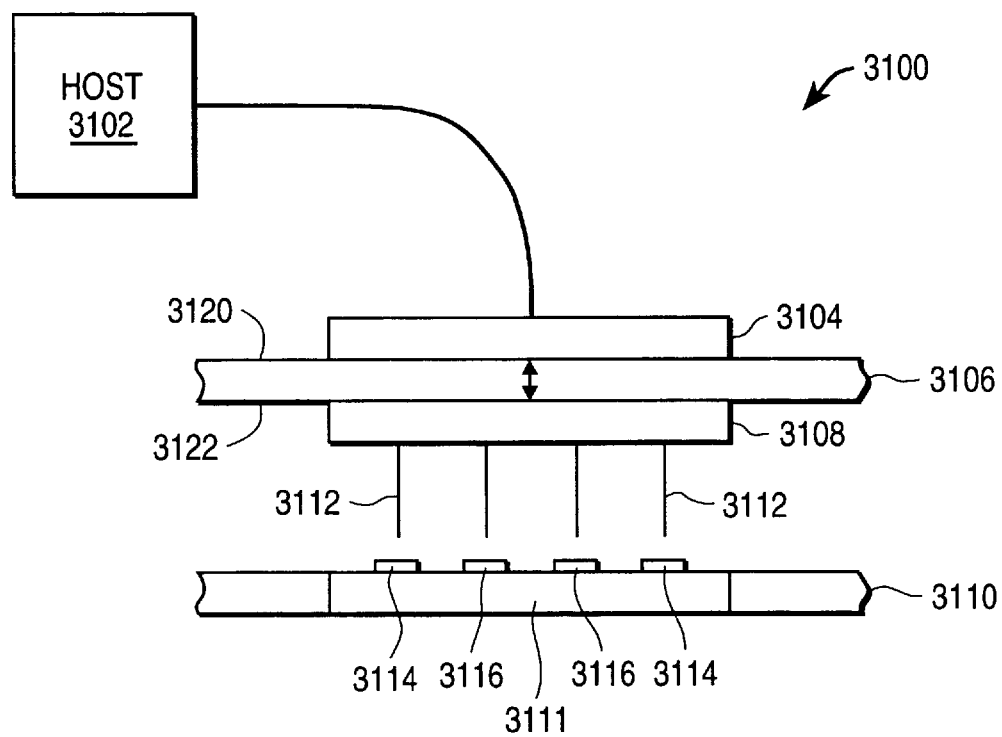
FIG. 31 is side cross-sectional view of one embodiment of a test assembly including a test die, a contactor, and a product die.

The embodiments shown in FIGS. 21–28 directly electrically connect (through contact structure 2018 and 2020) one or more test die and one or more product die designed according to the design methodologies described above. FIG. 31 shows a test assembly 3100 for performing a wafer-level sort test of a product die 3111 by a test die 3104.

Test die 3104 is indirectly electrically connected to product die 3110 through contactor 3108 and interconnection substrate 3106. Contactor 3108 may be any type of probe card such as a epoxy ring probe card, membrane probe card, or any type of probe card assembly such as those provided by FormFactor, Inc. of Livermore, Calif., and Wentworth Laboratories of Brookfield Conn.

Test die 3104 may be one or more test die such as test die 400 of FIG. 4 which has been generated by the design methodologies described above. Product die 3111 may one or more product die such as product die 300 of FIG. 3 which has also been generated by the design methodologies described above. Product die 3111 is formed on a wafer 3110 that may include other product die 3111. Wafer 3110 may be disposed on a suitable support structure such as a vacuum chuck (not shown). Product die 3111 also include bond pads 3114 and special contact pads 3116 to receive contact elements 3112. Contact elements 3112 may include cantilevered probe needles, contact balls of a membrane probe card, spring contact elements previously described, or any other electrical contact elements.

Interconnect substrate 3106 provides electrical interconnection between test die 3104 and contactor 3108. As shown in FIG. 31, test die 3104 may be disposed on the topside 3120 of substrate 3106. Alternatively, test die 3104 may be disposed on underside 3122 of substrate 3106. For yet another embodiment, test die 3104 may be disposed directly on contactor 3108.

Interconnect substrate 3106 may include sufficient routing, and contactor 3108 may include a sufficient number of contact elements 3112, to electrically connect test die 3104 to more than one product die 3111. For example, an entire wafer of product die may be simultaneously tested by one or more test die.

For one embodiment, test die 3104 may be mounted onto substrate 3104 and have its bond pads and special contact pads bonded out to substrate 3106, or it may be packaged first into a suitable semiconductor package (e.g., a surface mount, DIP, or LGA, C4, or flip-chip package, etc.) and then electrically connected to substrate 3106.

Substrate 3106 also provides structural support for test die 3104 and contactor 3108. Substrate 3106 may be one or more PCBs that perform the electrical interconnect and support functions, and may be attached to a structure (e.g., a wafer prober or chuck not shown) that supports wafer 3110.

Host 3102 communicates with test die 3104. Host 3102 may send signals to start and stop tests, to catalog results of tests and display them to a user, or to send other test data to test die 3104. Any type of host may be used including a personal computer, ATE, or any other control logic.

Figure 32:
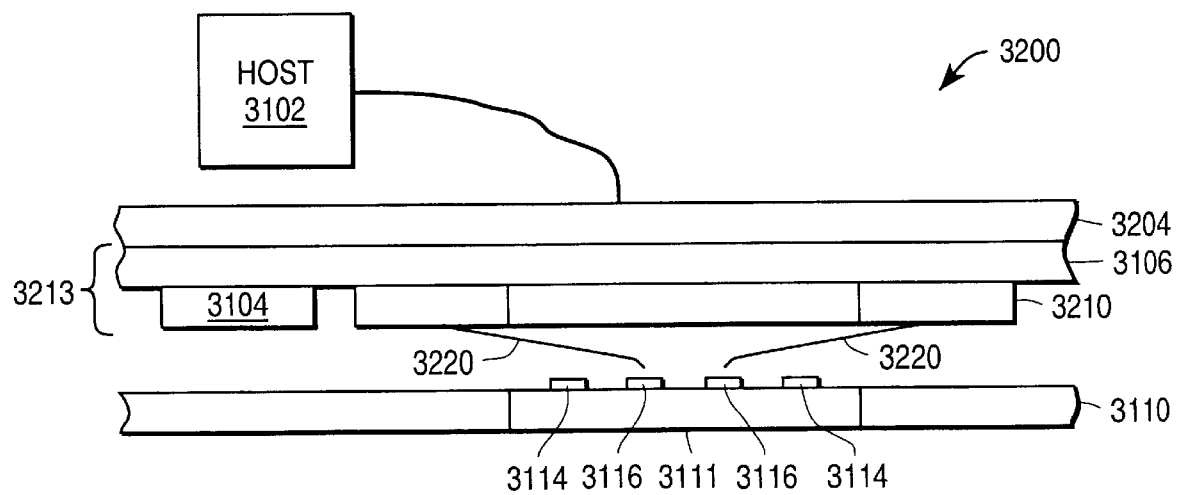
FIG. 32 is a side cross-sectional view of one embodiment of a test assembly having a test die and a probe card with cantilevered probes for probing special contact pads of a product die.

FIG. 32 illustrates a test assembly 3200 that is one embodiment of test assembly 3100 wherein contactor 3108 includes probe card 3120. Test assembly 3200 includes a test head 3204 and a probe card assembly 3210. Probe card assembly 3213 includes interconnection substrate 1306 (e.g., a test load board), test die 3104, and probe card 3210. Test die 3104 may be disposed on the underside of substrate 3106 or on probe card 3210 itself.

Figure 33:
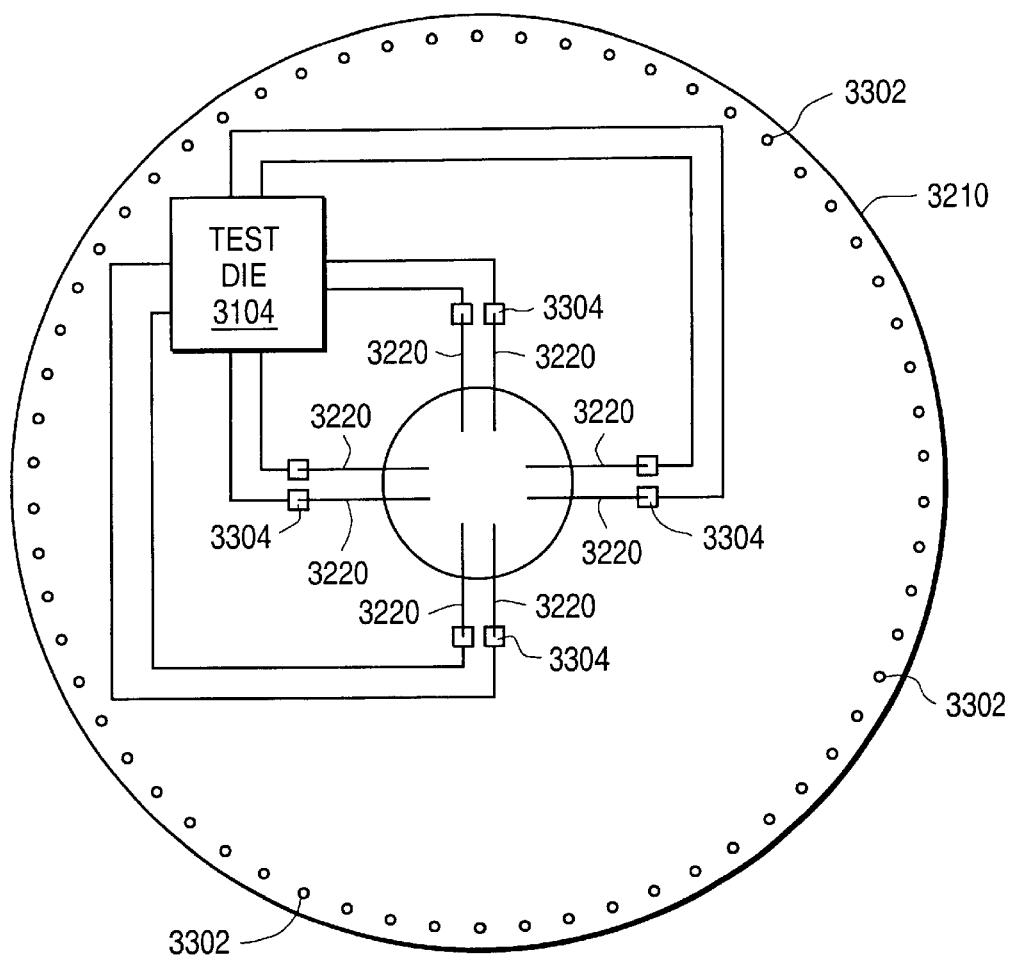
FIG. 33 is a plan view of the probe card of FIG. 32.

Probe card 3210 is a cantilevered or needle probe card that includes cantilevered probes 3220 that provide signals to and receive signals from product die 3111. Probes 3220 may comprise any suitable conductive material including tungsten. As shown in the plan view of probe card 3220 in FIG. 33, probes 3320 are connected to contact pins or points 3304 that contact test circuitry on test die 1304. Probe card 3210 may be secured to substrate 3106 through one or more securing pins 3302, screws, or other securing means.

Probes 3220 are provided to contact special contact pads 1316 when probe assembly 3213 is urged towards product die 3111. In alternative embodiments, separate probe cards may be used for initially testing product circuits by probing special contact pads 1316, and subsequently testing product device 3111 as a whole by probing bond pads 1314.

Figure 34:
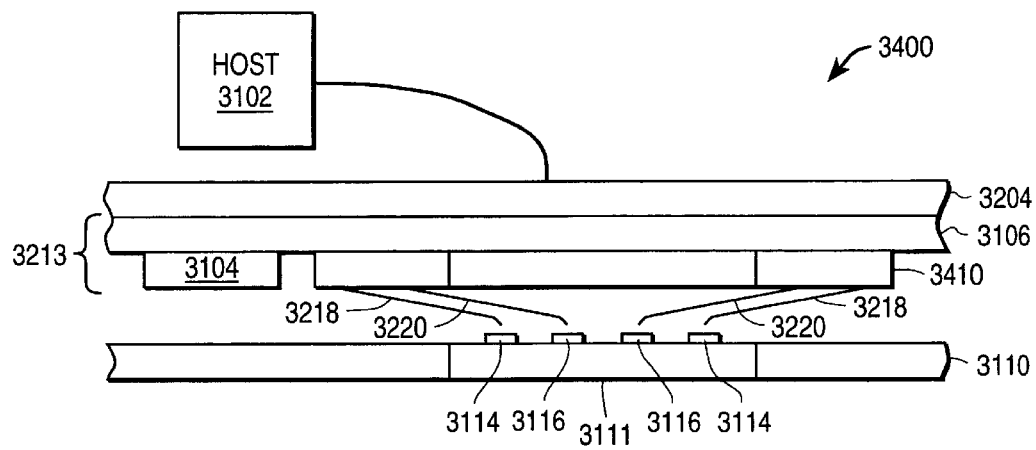
FIG. 34 is a side cross-sectional view of another embodiment of a test assembly having a test die and a probe with cantilevered probes for probing bond pads and special contact pads of a product die.
Figure 35:
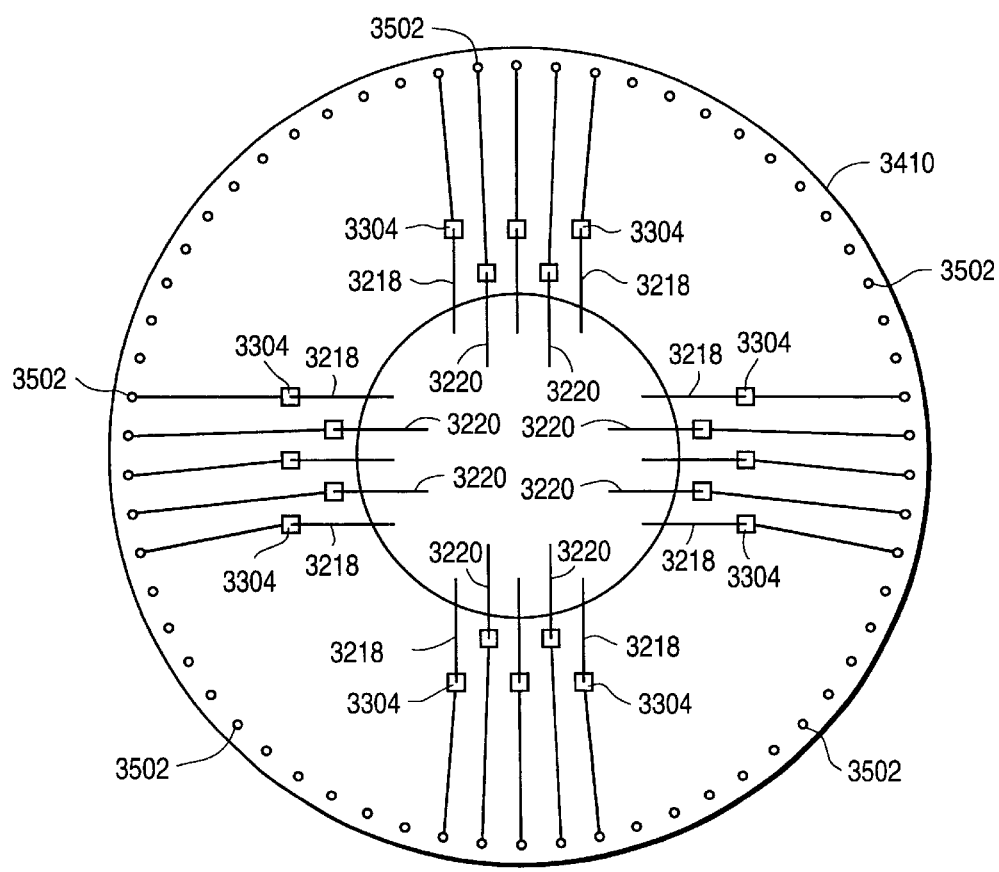
FIG. 35 is a plan view of the probe card of FIG. 34.

FIG. 34 shows another embodiment in which probes may be included on the same probe card 3410 to probe one or more of special contact pads 3116 and one or more of bond pads 3114. In this embodiment, probes 3220 may provide signals to or receive signals from special contact pads 3116 at the same or different times that probes 3218 provide signals to or receive from bond pads 3114. Probes 3118 are formed in a predetermined alignment to correspond to the alignment of bond pads 3114. As shown in plan view FIG. 35 of probe card 3410, probes 3118 make a relatively rectangular shape that will contact peripheral bond pads 3114 on product die 3111. Probes 3120 are generally not disposed in the same predetermined alignment of the probes 3118; rather, they extend into the region surrounded by probes 3118 (and bond pads 3114). In alternative embodiments, probes 1320 may exist outside of the region surrounded by probes 3118, or they may be disposed in the same predetermined alignment with probes 3118 and bond pads 3114. In another embodiment, probes 3118 may be arranged in a lead-on-center arrangement, or any other predetermined arrangement, to align with a similar arrangement of bond pads 3114 on product die 3111, and probes 3120 may be arranged within or outside of arrangement of probes 3118 to align with corresponding special contact pads 3116. For still other embodiments, bond pads 3114 and special contact pads 3116 may be arranged in any other alignment.

Probe card 3410 includes one or more contact pins 3502 that provide an electrical connection between substrate 3104 and probes 3218 and 3220. Test die 3104 may be disposed on probe card 3410 (as in FIG. 33), or may disposed outside of probe card 3410 (such as on substrate 3106) and electrical connections wired to pins 3502 or directly to interconnect points 3304.

For the embodiments shown in FIGS. 32–35, bond pads 3114 and special contact pads 3116 may have different heights. For example, bond pads 3114 may be taller than special contact pads 3116 (or vice versa). For this embodiment, probes 3118 and 3120 may extend to different depths. That is, probes 3120 may extend lower than probes 3118 to make contact with special contact pads 3116.

Figure 36:
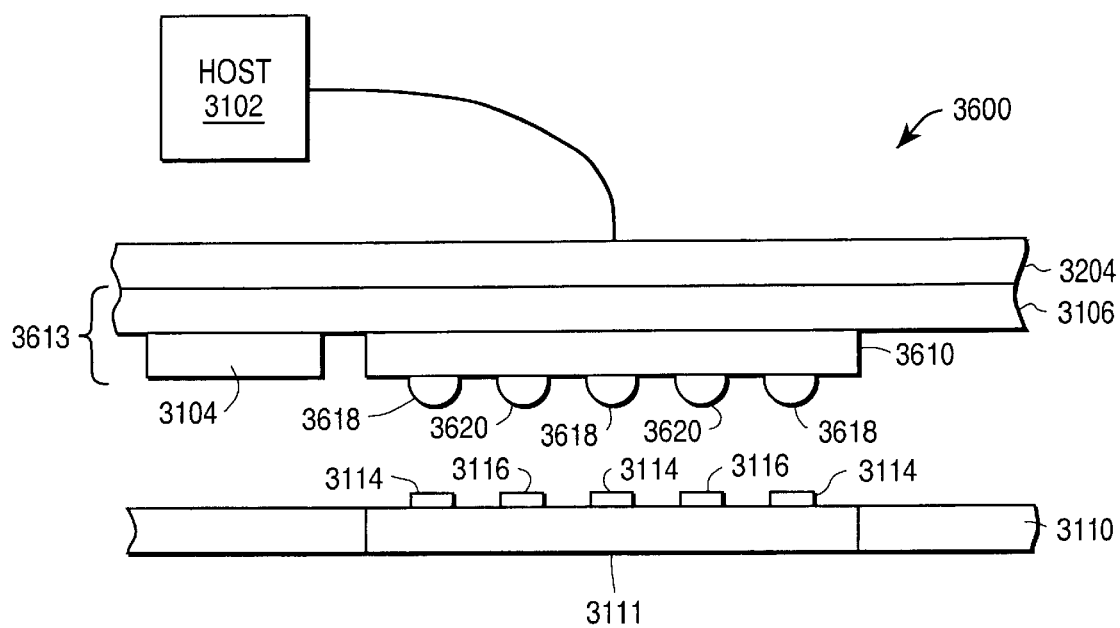
FIG. 36 is a side cross-sectional view of another embodiment of a test assembly having a membrane probe card with contacts for probing bond pads and special contact pads of a product die.

FIG. 36 illustrates a test assembly 3600 that is another embodiment of test assembly 3100. Test assembly 3600 includes test head 3204 and probe card assembly 3613. Probe card assembly 3613 includes interconnection substrate 3106, test die 3104, and membrane probe card 3610. Membrane probe card 3610 includes contact balls 3618 and 3620 that, when urged into contact with product die 3111, provide signals to and receive signals from bond pads 3114 and special contact pads 3116, respectively. Contact balls or probes 3618 and 3620 may comprise any suitable conductive material including solder.

Figures 37, 38:
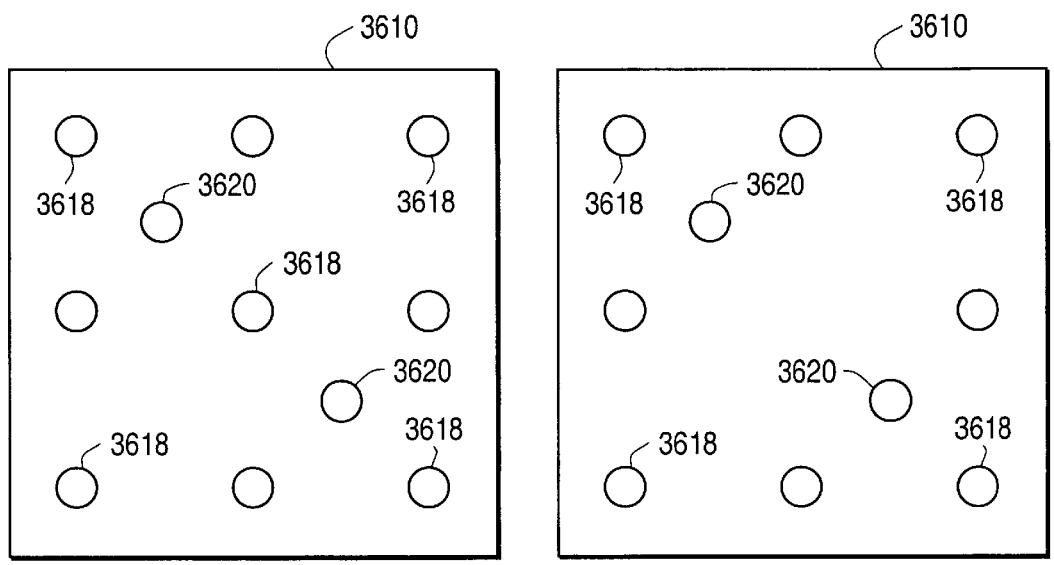
FIG. 37 is a plan view of the membrane probe card of FIG. 36 having contact balls aligned in a grid pattern and contact balls not aligned in the grid pattern.
FIG. 38 is a plan view of the membrane probe card of FIG. 36 having contact balls aligned in a peripheral pattern and contact balls not aligned in the peripheral pattern.

As shown in the plan view of probe card 3610 of FIG. 37, contact balls 3618 may be arranged in a grid array to contact bond pads 3114 arranged in a corresponding grid array pattern. Contact balls 3620 may be aligned within the predetermined grid array, outside of the grid array pattern, or interspersed within the grid array pattern as shown in FIG. 37 to match corresponding special contact pads 3116 on product die 3110. Alternatively, as shown in FIG. 38, contact balls 3618 may be arranged in a peripheral pattern to contact bond pads 3114 arranged in a corresponding peripheral pattern. Contact balls 3620 may be arranged with the predetermined peripheral pattern, outside of the peripheral pattern, or within the peripheral pattern as shown in FIG. 38 to align with corresponding special contact pads 3116. In yet another embodiment, contact balls 3618 may be arranged in a lead-on-center arrangement to align with lead-on-center bond pads on product die 3110, and contact balls 3620 may be arranged within or outside of the lead-on-center arrangement to align with corresponding special contact pads.

For another embodiment, contact balls 3620 may be replaced with spring contact elements previously described above. In this embodiment, special contact pads 3116 may be selectively placed within the grid array of bond pads 3114 as shown in FIG. 11, and may be smaller than the size of bond pads 3114 as shown in FIG. 12 so as not to increase the die size product die 3110 by the addition of the special contact pads. For still other embodiments, bond pads 3114 and special contact pads 3116 may be arranged in any other alignment.

Test die 3104 is electrically connected to one or more of probes 3620 through substrate 3106. Test die 3104 may also be electrically connected to one or more of probes 3618 through substrate 3106. Alternatively, test die 3104 may be disposed directly on probe card 3610, or in any other location of test assembly 3600

While FIGS. 36–38 show that a single membrane probe card may be used to communicate with special contact pads 3116 and bond pads 3114, in alternative embodiments, separate membrane probe cards may be used for probing special contact pads 3116 and bond pads 3114. That is, one or more probe cards may be used to initially contact only special contact pads 3116 with one or more of contact balls 3618 and test one or more product circuits of product die 3111. Subsequently, one or more additional probe cards may be used to subsequently contact bond pads 3114 with one or more contact balls 3220 to test product die 3111 as a whole. In still other embodiments, multiple probe cards may be used that have a mixture of contact balls 3618 and 3620.

For an alternative embodiment, bond pads 3114 and special contact pads 3116 may be of different heights. For example, bond pads 3114 may be taller than special contact pads 3116 (or vice versa). For this embodiment, contact balls 3218 and 3220 may have different heights. That is, contact balls 3220 may extend lower than contact balls 3218 to make contact with special contact pads 1516. Alternatively, other probe elements such as spring contact elements may be used to probe the shorter special contact pads 3116.

Figure 39:
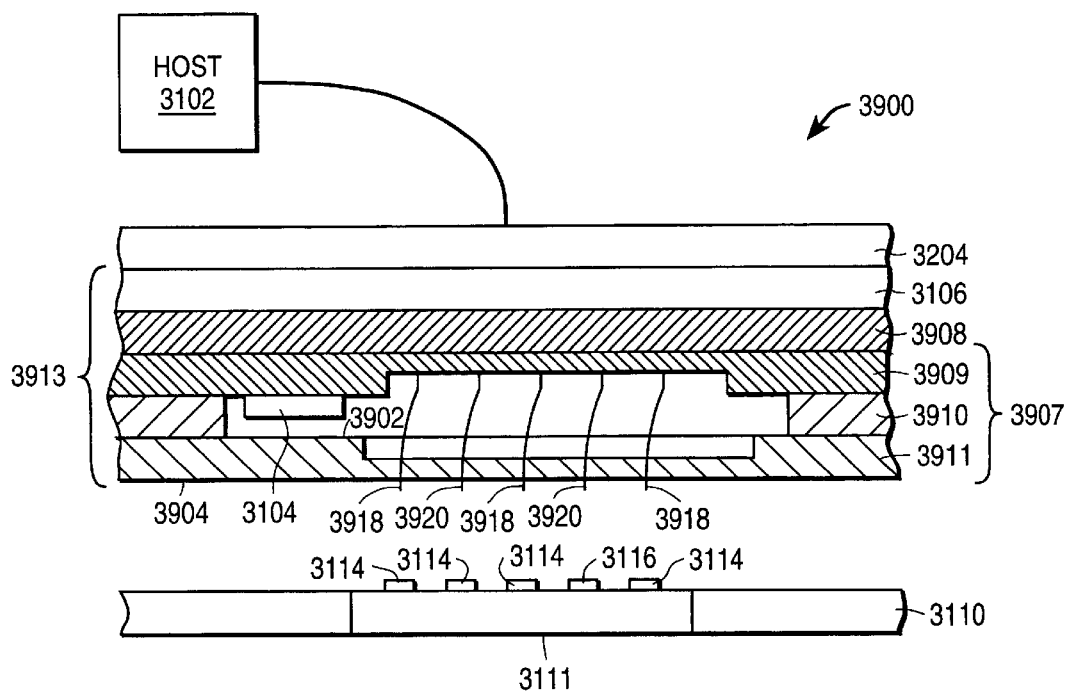
FIG. 39 is a side cross-sectional view of another embodiment of a test assembly having a COBRA-style probe card assembly with probes for probing bond pads and special contact pads of a product die.

FIG. 39 illustrates a test assembly 3900 that is another embodiment of test assembly 3100 including test head 3204 and COBRA-style probe card assembly 3913. The COBRA-style probe card assembly is available from Wentworth Laboratories of Brookfield Conn. Probe card assembly 3913 includes interconnection substrate 3106, space transformer (either wired or ceramic) 3908, and head assembly 3907. Head assembly 3907 includes upper plate 3909, spacer 3910, lower plate 3911, test die 3104, and COBRA-style probes 3918 and 3920. When urged toward product die 3111, probes 3918 and 3920 provide signals to and receive signals from bond pads 3114 and special contact pads 3116, respectively.

Test die 3104 is electrically connected to one or more of probes 3920 and may also be electrically connected to one or more of probes 3918. Test die 3104 may be disposed on the underside of upper die 3909 as shown in FIG. 39, on the topside 3902 of lower plate 3911, on the underside 3904 of lower plate 3911, on interconnect substrate 3106, or in any other location of test assembly 3900.

Figures 40, 41:
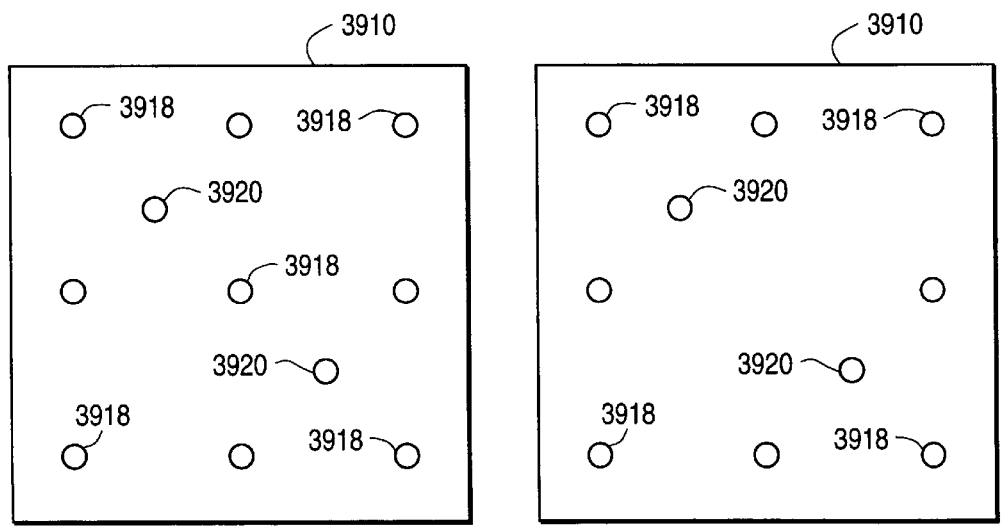
FIG. 40 is a plan view of the COBRA-style probe tips of FIG. 39 having some tips aligned in a grid pattern and other tips not aligned in the grid pattern.
FIG. 41 is a plan view of the COBRA-style probe tips of FIG. 39 having some tips aligned in a peripheral pattern and other tips not aligned in the peripheral pattern.

Probes 3918 are generally formed in a grid array to contact bond pads 3914 arranged in a corresponding grid array pattern. Probes 3920 may be arranged aligned in the predetermined grid array, outside of the grid array pattern, or interspersed within the grid array pattern as shown in FIG. 40 to connect to special contact pads 1816. Alternatively, as shown in FIG. 41, probes 3918 may be arranged in a peripheral pattern to contact bond pads 3114 arranged on product die 3111 in a corresponding peripheral pattern. Probes 3920 may be aligned in the predetermined peripheral pattern, outside of the peripheral pattern, or within the peripheral pattern as shown in FIG. 41 to probe special contact pads 3116. In yet another embodiment, probes 3918 may be arranged in a lead-on-center arrangement to align with lead-on-center bond pads on product die 3111, and probes 3920 may be aligned within or outside of the lead-on-center arrangement to align with corresponding special contact pads. For still other embodiments, bond pads 3114 and special contact pads 3116 may be arranged in any other alignment.

While FIGS. 39–41 show that a single probe card assembly may be used to communicate with special contact pads 3116 and bond pads 3114, in alternative embodiments, separate probe cards may be used for probing special contact pads 3116 and bond pads 3114. That is, one or more probe cards may be used to initially contact only special contact pads 3116 with one or more of probes 3920 an test associated product circuits of product die 3111. Subsequently, one or more additional probe cards may be used to subsequently contact bond pads 3114 with one or more probes 3918 to test product die 3111 as a whole. In still other embodiments, multiple probe card assemblies may be used that have a mixture of probes 3918 and 3920.

For an alternative embodiment, bond pads 3114 and special contact pads 3116 may be of different heights. For example, bond pads 3114 may be taller than special contact pads 3116 (or vice versa). For this embodiment, probes 3918 and 3920 may extend to different depths (or have different heights). That is, probes 3920 may extend lower than probes 3918 to make contact with special contact pads 3116.

Figure 42:
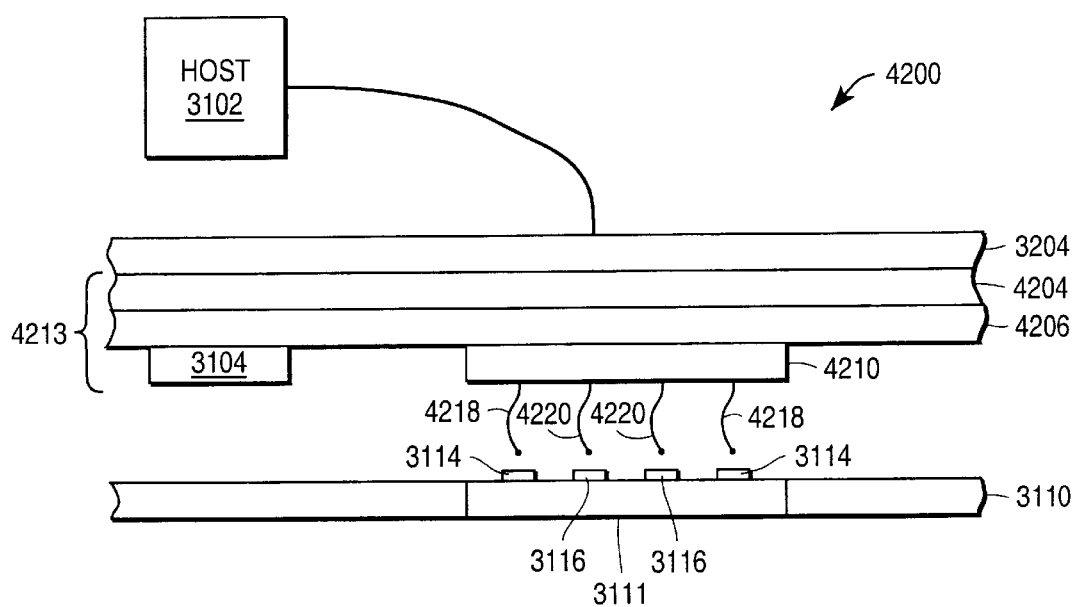
FIG. 42 is a side cross-sectional view of another embodiment of a probe card assembly having spring contact elements for probing bond pads and special contact pads of a product die.

FIG. 42 illustrates test assembly 4200 that is another embodiment of test assembly 3100 including test head 3204 and a probe card assembly 4213 such as that provided by FormFactor, Inc. or Livermore, Calif. One embodiment of probe card assembly 4213 is disclosed in PCT international publication number WO 96/38858. Probe card assembly 4213 includes probe card 4204, interposer 4206, space transformer 4210, and spring contact elements 4218 and 4220. When urged toward product die 3111, spring contact elements 4218 and 4220 provide signals to and receive signals from bond pads 3114 and special contact pads 3116, respectively.

Test die 3104 is electrically connected to one or more of probes 4220 and may also be electrically connected to one or more of probes 4218. Interconnection may be made by probe card 4204, interposer 4206, or space transformer 4210. Test die 3104 may be disposed on the underside of interposer 4206 as shown in FIG. 42, on space transformer 4210, on probe card 4204, or in any other location of test assembly 4200.

Spring contact elements 4218 are provided in a predetermined alignment to provide signals to and receive signals from corresponding bond pads 3114. For one embodiment, probes 4218 are arranged in a grid array pattern. Spring contact elements 4220 may be arranged aligned in the predetermined grid array, outside of the grid array pattern, or interspersed within the grid array pattern to align with corresponding special contact pads 3116. For another embodiment, spring contact elements 4218 may be arranged in a peripheral pattern. Spring contact elements 4220 may be arranged in an area surrounded by the predetermined peripheral pattern, outside of the peripheral pattern, or interspersed in the peripheral pattern to align with corresponding special contact pads 3116. For yet another embodiment, spring contact elements 4218 may be arranged in a lead-on-center arrangement, and spring contact elements 4220 may be arranged within or outside of the lead-on-center arrangement to align with corresponding special contact pads. For still other embodiments, bond pads 3114 and special contact pads 3116 may be arranged in any other alignment.

While FIG. 42 shows that a single probe card assembly may be used to communicate with special contact pads 3116 and bond pads 3114, in alternative embodiments, separate probe card assemblies (or probe cards) may be used for probing special contact pads 3116 and bond pads 3114. That is, one or more probe card assemblies may be used to initially contact only special contact pads 3116 with one or more of spring contact elements 4220 in order to test one or more product circuits of product die 3111. Subsequently, one or more additional probe card assemblies may be used to contact bond pads 3114 with one or more spring contact elements 4218 to test product die 3111 as a whole. In still other embodiments, multiple probe card assemblies may be used that have a mixture of spring contact elements 4218 and 4220.

For an alternative embodiment, bond pads 3116 and special contact pads 3116 may be of different heights. For example, bond pads 3114 may be taller than special contact pads 3116 (or vice versa). For this embodiment, probes 4218 and 4220 are extended to different depths (or have different heights). That is, probes 4220 may extend lower than probes 4218 to make contact with special contact pads 3116.

For an alternative embodiment, spring contact elements 4218 and 4220 may be attached to bond pads 3114 and special contact pads 3116 on product die 3111. For this embodiment, space transformer 4210 may include pads for making contact with the spring contact elements 4218 and 4220. For yet another embodiment, some of the spring contact elements 4218 or 4220 may attached to space transformer 4210 and some may be attached to product die 3111.

A product die generated by the design methodologies described above may also be inserted into a socket to be tested by a test die. The product die may be packaged in any generally known package for semiconductor integrated circuits, or need not be packaged (e.g., in a chip-scale configuration). Any generally known socket may be used to support the product die. The test die may be mounted to a printed circuit board and may directly contact the product die (e.g., through spring contact elements or the like), or may indirectly contact the product die through a contactor, edge connector, and the like.

Figure 46:
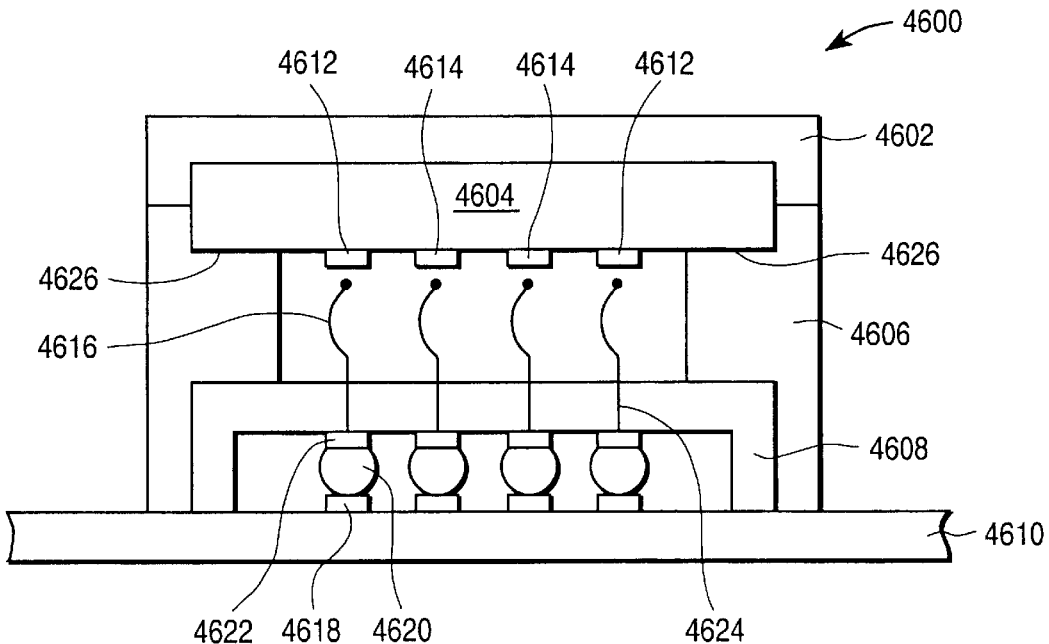
FIG. 46 is a side cross-sectional view of one embodiment of a socket for retaining a package having special contact points and conventional input, output, and input/output pins.

FIG. 46 illustrates one embodiment of solder-down (surface mount) LGA socket 4600 for mounting to a printed circuit board (PCB) substrate 4610 and for making pressure contacts to bond pads 4612 and special contact pads 4614 of LGA package 4604. LGA package 4604 may include a product die designed according to the design methodologies described above. As used herein, the term "socket" refers to an electronic component having interconnection elements, suitable for making electrical connection to terminals or connection points of another electronic component. The socket shown in FIG. 46 is intended to permit a semiconductor package to be removably connected to a circuit board. Other embodiments of socket 4600 are disclosed in commonly-owned U.S. Pat. No. 5,772,451 which is incorporated herein by reference.

PCB 4610 has a plurality of terminals or pads 4618, and package 4604 have a plurality of bond pads 4612 and special contact pads 4614. Socket 4600 provides a means for electrically interconnecting terminals 4618 with pads 4612 and 4614. Test circuitry provided on PCB 4610, or in communication therewith, may provide signals to or monitor signals from pads 4612 and 4614 through socket 4600. For example, programmable circuitry within package 4604 may be programmed or monitored through spring contact elements 4616, special contact pads 4614 and/or pads 4612.

Socket 4600 includes a support substrate 4608 formed, for example, from a conventional PCB material. Support substrate 4608 includes spring contact elements 4616 formed on a top surface thereof, and pads 4622 formed on a bottom surface thereof. Spring contact elements 4616 are for contacting pads 4612 and 4614 of package 4604 when package 4604 is urged downward by a forced applied to the topside of package 4604 by retaining means 4602. Other contact elements besides spring contact elements may also be used. Support substrate 4608 also includes electrical conduits 4624 that provide an electrical interconnection between spring contact elements 4616 and pads 4622. For an alternative embodiment, spring contact elements 4616 may be connected directly to terminals 4618.

Contact balls (such as conventional solder balls) are disposed on the bottom surface of pads 4622. The contact balls 4622 serve as contact structures disposed on the bottom surface of the support substrate 4608 to contact corresponding pads or terminals 4618 on PCB 4610. Other electrical contact structures may also be used.

Socket 4600 also includes a frame 4606 that is attached to PCB 4602. Frame 4606 includes landings 4626 to support package 4604. Socket 4600 also includes retaining means 4602 that is disposed over frame 4626 and package 4604. Retaining means 4602 retains package 4604 on landings 4626 such that spring contact elements 4616 remain in electrical contact with pads 4612 and 4614. Any suitable mechanical means may be used for retaining means 4602 including, for example, a spring clip.

Figure 47:
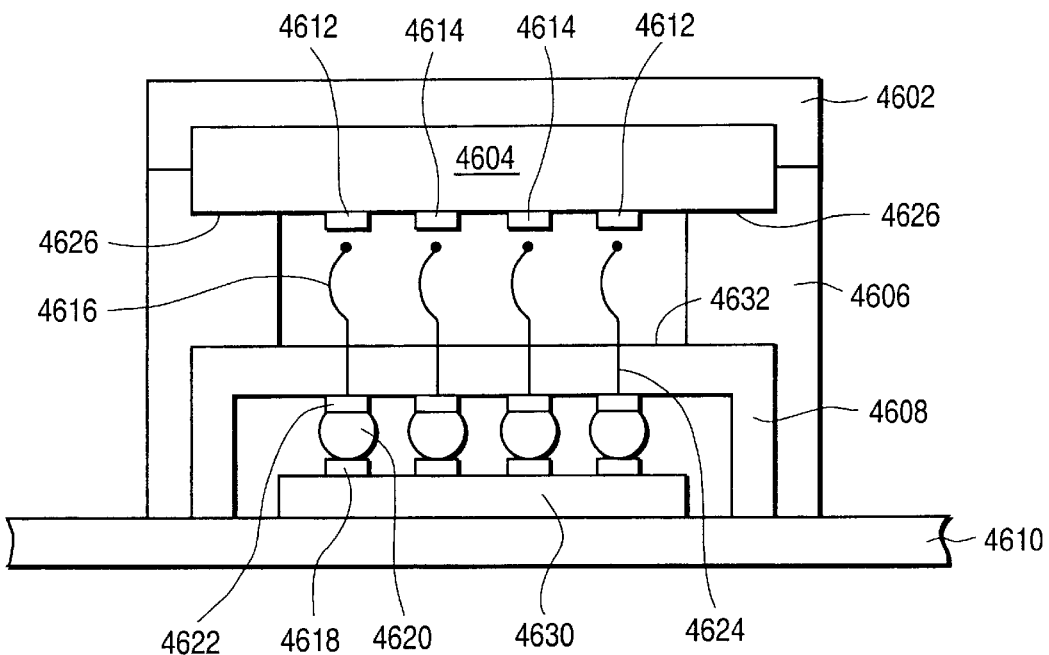
FIG. 47 is a side cross-sectional view of another embodiment of a socket including a test die on a printed circuit board.

FIG. 47 shows another embodiment of socket 4600 in which test die 4630 is disposed on PCB 4610. Test die 4630 may be designed according to the design methodologies described above. Terminals or pads 4618 may be formed on test die 4630 to electrically interface with contact balls 4620. For other embodiments, spring contact elements 4616 may be directly connected to terminals 4618.

Additionally, and/or alternatively, one or more of the spring contact elements 4616 may be attached to pads 4612 and 4614. In this configuration, the spring contact elements may contact pads or terminals on topside 4632 of support substrate 4608, or the spring contact elements may directly contact terminals 4618.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method of designing a test die for a product die, comprising:
   designing a test circuit and a product circuit in a unified design, the test circuit for testing during manufacture a product die into which the product circuit is integrated;
   partitioning the unified design into the test circuit and the product circuit;
   generating data for manufacture of a test die that includes the test circuit; and
   generating data for manufacture of the product die, wherein the test die and the product die are separate dies.

2. The method of claim 1, further comprising the step of separately fabricating the test die and product die.

3. The method of claim 1, further comprising the step of generating a description of interconnect points between the test circuit and the product circuit.

4. The method of claim 1, further comprising the step of determining test capabilities of a host controller that communicates with the test die.

5. The method of claim 4, further comprising the step of selecting a first test for execution by the test circuit and a second test for execution by the host controller.

6. The method of claim 1, further comprising:
   determining if the partitioned test die and product die satisfy predetermined constraints; and
   repeating the partitioning and determining steps until the predetermined constraints are satisfied.

7. The method of claim 6, wherein the predetermined constraints include the physical size of each of the test die and the product die.

8. The method of claim 6, wherein the predetermined constraints include cost of manufacturing each of the test die and the product die.

9. The method of claim 6, wherein the predetermined constraints include a selected amount of fault coverage for testing the product circuit.

10. The method of claim 6, wherein the predetermined constraints include speed test accuracy of signals in the product die monitored by the test circuit.

11. The method of claim 6, wherein the predetermined constraints include fabrication process parameters of each of the test die and the product die.

12. The method of claim 6, wherein the predetermined constraints include AC timing parameters of signals in the product die monitored by the test circuit.

13. The method of claim 6, wherein the determining step further comprises simulating a partition of the test die and the product die.

14. The method of claim 6, further comprising the step of generating a number of interconnection points on the test die and the product die, and wherein the predetermined constraints include the number of interconnection points.

15. The method of claim 1, further including designing a second test circuit.

16. The method of claim 15, further including generating data for manufacture of the second test circuit on the product die.

17. The method of claim 16, wherein the second circuit comprises Built-In Self-Test (BIST) circuitry.

18. The method of claim 16, wherein the second circuit comprises SCAN circuitry.

19. The method of claim 1, wherein the test circuit is capable of testing a plurality of product die each having the product circuit.

20. The method of claim 1, further comprising adjusting the test circuit.

21. The method of claim 20, wherein the adjusting comprises adding additional circuitry to the test circuit.

22. The method of claim 20, wherein the adjusting further comprises removing some of the test circuit.

23. The method of claim 1, further comprising the step of adding Built-In Self-Test (BIST) circuitry to the product die.

24. A method of designing a test die and a product die, comprising:
  designing a plurality of test circuits and a plurality of product circuits in a unified design, the test circuits for communicating with the product circuits;
  partitioning the unified design into the plurality of test circuits and the plurality of product circuits;
  generating data for manufacturing at least one test die that includes the plurality of test circuits; and
  generating data for manufacturing at least one product die that includes the plurality of product circuits, wherein the at least one test die and the at least one product die are separate dies.

25. The method of claim 24, wherein each test circuit comprises unique circuitry.

26. The method of claim 24, wherein one of the plurality of test circuits includes test circuitry commonly used by all of the test circuits.

27. The method of claim 26, wherein the commonly used test circuitry comprises a pattern generator.

28. The method of claim 26, wherein the commonly used test circuitry communicates with a host controller.

29. The method of claim 24, further comprising the step of fabricating the at least one test die and the at least one product die on separate semiconductor wafers.

30. The method of claim 24, further comprising:
  determining if the at least one test die and the at least one product die satisfy predetermined constraints; and
  repeating the partitioning and determining steps until the predetermined constraints are satisfied.

31. A method of producing a tester, comprising:
  generating a product circuit and test circuit, wherein the test circuit includes circuitry for testing the product circuit;
  partitioning circuitry between the product circuit and the test circuit;
  evaluating the partition; and
  fabricating the product circuit and the test circuit on different dies.

32. The method of claim 31, wherein the partitioning step and evaluating steps are repeated until predetermined constraints are satisfied.

33. A test die for testing product circuitry of a separate product die, the test die comprising:
  test circuitry generated by:
    (i) concurrently designing the test circuitry and the product circuitry into a unified design,
    (ii) partitioning the test circuitry from the product circuitry, and
    (iii) fabricating the test circuitry into the test die, which is separate from the product die into which the product circuitry is fabricated.

34. The test die of claim 33, wherein the test die is further generated by:
  determining if the test circuitry satisfies predetermined constraints; and
  iteratively repartitioning the unified design and performing the determining step until the predetermined constraints are satisfied.

35. The test die of claim 33, further comprising a plurality of pads coupled to the test circuitry.

36. The test die of claim 35, wherein the plurality of pads comprise:
  bond pads; and
  special contact pads for receiving spring contact elements.

37. The test die of claim 36, wherein the bond pads and special contact pads have different heights.

38. The test die of claim 35, further comprising contact elements coupled to the pads and electrically coupling the test circuitry and the product circuitry.

39. The test die of claim 38, wherein the contact elements have different heights.

40. The test die of claim 38, wherein the plurality of contact elements comprise spring contact elements.

41. The test die of claim 38, wherein the plurality of contact elements comprise contact balls.

42. The test die of claim 33, wherein the test circuitry is configured to test AC parametrics of the product circuitry.

43. The test die of claim 33, wherein the test circuitry is configured to test DC parametrics of the product circuitry.

44. The test die of claim 33, wherein the test circuitry is configured to program the product circuitry.

45. The test die of claim 33, wherein the test circuitry is configured to enable redundant circuitry of the product circuitry.

46. A medium readable by a computing device, the medium storing a sequence of instructions for generating a description of a test die and a description of a product die, wherein the instructions cause the computing device to:
  generate a unified circuit design including product circuitry and test circuitry for testing said product circuitry; and
  partition the unified circuit design into separate descriptions of the test circuitry to be integrated into a test die and the product circuitry to be integrated into a product die, wherein the test die and the product die are separate dies.

47. The medium of claim 46, wherein the instructions cause the computing device to further:
  determine if the descriptions of the test circuitry and product circuitry satisfy predetermined constraints; and
  repartition the unified circuit design into updated descriptions of the test circuitry and product circuitry until the predetermined constraints are satisfied.

48. A method of designing a product die for a test die, comprising:
  designing a product circuit to be tested by a predetermined test circuit, the product circuit and test circuit incorporated into a unified design; and
  partitioning the unified design into the test circuit to be integrated into a test die and the product circuit to be integrated into a product die, wherein the test die and the product die are separate dies.

49. The method of claim 48, further comprising the step of separately fabricating the product die and test die.

* * * * *